(12) United States Patent
Yang et al.

(10) Patent No.: US 12,451,857 B2
(45) Date of Patent: Oct. 21, 2025

(54) ATTENUATION CIRCUIT

(71) Applicant: NXP B.V., Eindhoven (NL)

(72) Inventors: Xin Yang, Houten (NL); Dominicus Martinus Wilhelmus Leenaerts, Riethoven (NL); Rana Azhar Shaheen, Caen (FR)

(73) Assignee: NXP B.V., Eindhoven (NL)

( * ) Notice: Subject to any disclaimer, the term of this patent is extended or adjusted under 35 U.S.C. 154(b) by 492 days.

(21) Appl. No.: 18/051,596

(22) Filed: Nov. 1, 2022

(65) Prior Publication Data

US 2023/0170871 A1 Jun. 1, 2023

(30) Foreign Application Priority Data

Nov. 30, 2021 (EP) ..................................... 21306663

(51) Int. Cl.
*H03H 7/25* (2006.01)
*H03F 3/19* (2006.01)

(52) U.S. Cl.
CPC ............... *H03H 7/255* (2013.01); *H03F 3/19* (2013.01); *H03F 2200/451* (2013.01)

(58) Field of Classification Search
CPC ..... H03F 3/245; H03F 2200/451; H01P 3/081
USPC ........................................................ 330/297
See application file for complete search history.

(56) References Cited

U.S. PATENT DOCUMENTS

| 3,634,775 A | 1/1972 | Ulmer et al. |
| 5,600,472 A | 2/1997 | Uesaka |
| 10,193,531 B2 | 1/2019 | Shrivastava |
| 2003/0184461 A1* | 10/2003 | Goyette ............... H03G 1/0058 341/139 |

(Continued)

FOREIGN PATENT DOCUMENTS

| CN | 107819476 A | * | 3/2018 | ............ G08C 17/02 |
| DE | 2937020 A1 | | 4/1981 | |
| EP | 0463710 A2 | | 1/1992 | |

(Continued)

OTHER PUBLICATIONS

Kodak, U., "A 5G 28-GHz Common-Leg T/R Front-End in 45-nm CMOS SOI With 3.7-dB NF and -30-dBc EVM With 64-QAM/ 500-MBaud Modulation", IEEE Transactions on Microwave Theory and Techniques, vol. 67, No. 1, Jan. 2019.

*Primary Examiner* — Hafizur Rahman

(57) ABSTRACT

An attenuation circuit comprising: a connection-node for connecting to an RF connection; an isolation-capacitor connected in series between the connection-node and an internal-node; a first-bias-resistor connected in series between a first-control-node and the internal-node; a second-bias-resistor connected in series between the internal-node and a second-control-node; a first-attenuation-diode connected in series between the first-control-node and the internal-node, wherein the anode of the first-attenuation-diode is closest to the first-control-node; a second-attenuation-diode connected in series between the internal-node and the second-control-node, wherein the anode of the second-attenuation-diode is (Continued)

closest to the internal-node; a first-decoupling-capacitor connected in series between the first-control-node and the reference-node; and a second-decoupling-capacitor connected in series between the second-control-node and the reference-node.

19 Claims, 15 Drawing Sheets

(56) References Cited

U.S. PATENT DOCUMENTS

2022/0385286 A1* 12/2022 Kurusu .................... H03F 1/52

FOREIGN PATENT DOCUMENTS

| GB | 1362618 A | | 8/1974 |
|----|-----------|---|--------|
| JP | 06334464 A | * | 12/1994 |
| JP | H06334464 A | | 12/1994 |

* cited by examiner

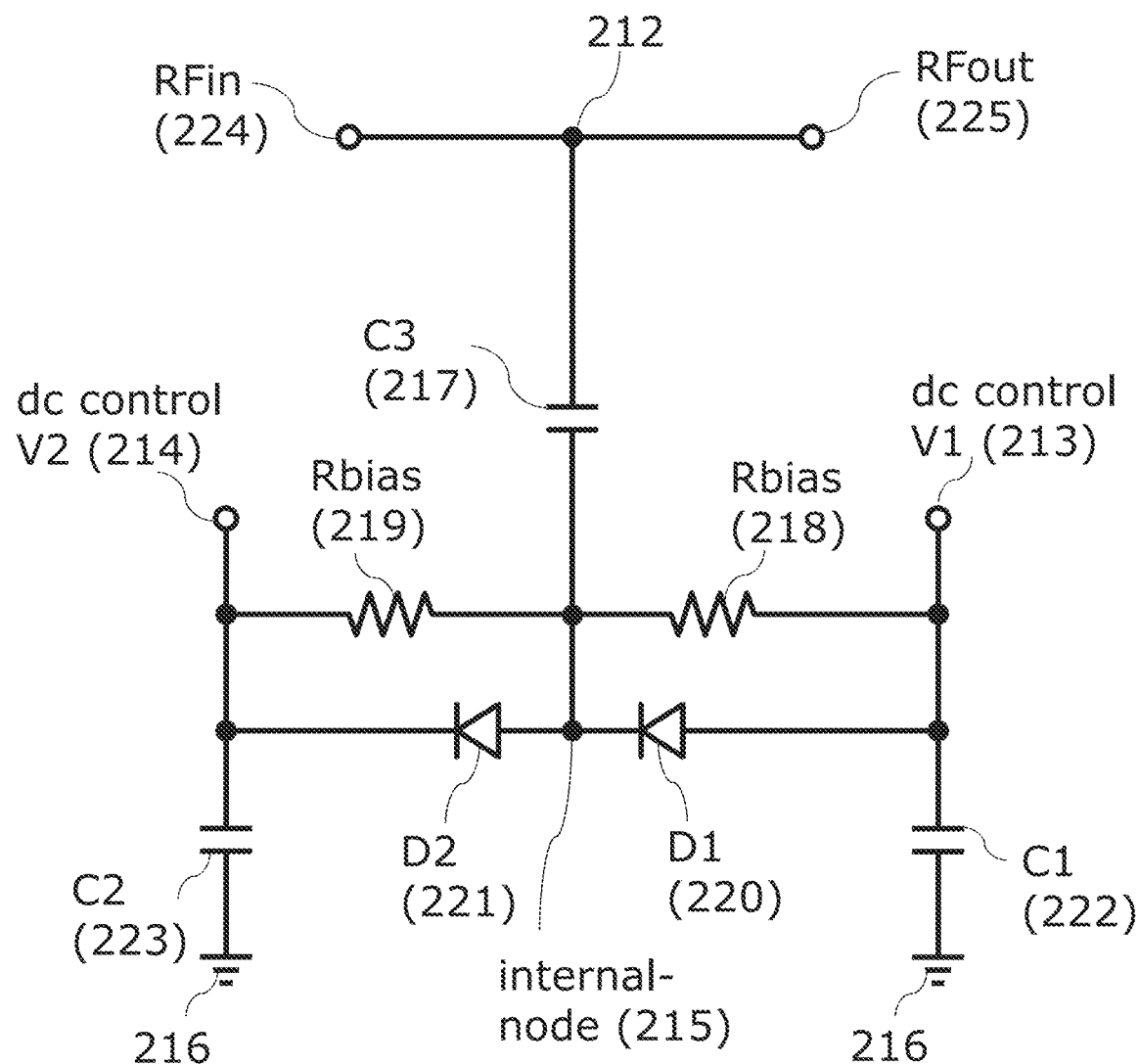

ATTENUATION CIRCUIT

CROSS-REFERENCE TO RELATED APPLICATIONS

This application claims the priority under 35 U.S.C. § 119 of European Patent application no. 21306663.2, filed on 30 Nov. 2021, the contents of which are incorporated by reference herein.

FIELD

The present disclosure relates to attenuation circuits for RF connections.

SUMMARY

According to a first aspect of the present disclosure there is provided an attenuation circuit comprising:
  a connection-node for connecting to an RF connection;
  a first-control-node configured to receive a first-control-signal;
  a second-control-node configured to receive a second-control-signal;
  an internal-node;
  a reference-node for connecting to a reference terminal;
  an isolation-capacitor connected in series between the connection-node and the internal-node;
  a first-bias-resistor connected in series between the first-control-node and the internal-node;
  a second-bias-resistor connected in series between the internal-node and the second-control-node;
  a first-attenuation-diode connected in series between the first-control-node and the internal-node, wherein the anode of the first-attenuation-diode is closest to the first-control-node;
  a second-attenuation-diode connected in series between the internal-node and the second-control-node, wherein the anode of the second-attenuation-diode is closest to the internal-node;
  a first-decoupling-capacitor connected in series between the first-control-node and the reference-node; and
  a second-decoupling-capacitor connected in series between the second-control-node and the reference-node.

Advantageously, such a circuit can have low insertion loss, low gain-to-phase error and a compact layout size In one or more embodiments the attenuation circuit comprises a single connection-node for connecting to an RF connection in parallel.

In one or more embodiments the attenuation circuit is in an attenuation mode of operation when the first-control-signal has a higher voltage than the second-control-signal.

In one or more embodiments the attenuation circuit is in a bypass mode of operation when the first-control-signal has a lower voltage than the second-control-signal.

In one or more embodiments the attenuation circuit further comprises a first-attenuation-resistor and a second-attenuation-resistor. The first-attenuation-resistor and the first-attenuation-diode may be connected in series with each other between the first-control-node and the internal-node. The second-attenuation-resistor and the second-attenuation-diode may be connected in series with each other between the internal-node and the second-control-node.

In one or more embodiments the first-attenuation-resistor and the first-attenuation-diode are connected in series with each other, in that order, between the first-control-node and the internal-node.

In one or more embodiments the second-attenuation-diode and the second-attenuation-resistor and are connected in series with each other, in that order, between the internal-node and the second-control-node.

In one or more embodiments the attenuation circuit may further comprise a tuning-inductor connected in series between the connection-node and an AC-reference-node.

In one or more embodiments the attenuation circuit may further comprise:
  a first-attenuation-resistor having a first terminal and a second terminal;
  a second-attenuation-resistor having a first terminal and a second terminal;
  a first-compensation-diode having an anode-terminal and a cathode-terminal; and
  a second-compensation-diode having an anode-terminal and a cathode-terminal;
  wherein:
  the first-terminal of the first-resistor is connected to the first-control-node;
  the second-terminal of the first-resistor is connected to the anode-terminal of the first-attenuation-diode;
  the cathode-terminal of the first-attenuation-diode is connected to the internal-node;
  the anode-terminal of the second-attenuation-diode is connected to the internal-node;
  the cathode-terminal of the second-attenuation-diode is connected to the first-terminal of the second-attenuation-resistor;
  the second-terminal of the second-attenuation-resistor is connected to the second-control-node;
  the anode-terminal of the first-compensation-diode is connected to the second-terminal of the first-resistor;
  the cathode-terminal of the first-compensation-diode is connected to the anode-terminal of the second-compensation-diode; and
  the cathode-terminal of the second-compensation-diode is connected to the first terminal of the second resistor.

In one or more embodiments the attenuation circuit may further comprise one or both of:
  a first-compensation-capacitor connected in series between: i) the internal-node; and ii) the connection between the cathode-terminal of the first-compensation-diode and the anode-terminal of the second-compensation-diode; and
  a second-compensation-capacitor connected in series between: i) the connection between the cathode-terminal of the first-compensation-diode and the anode-terminal of the second-compensation-diode; and ii) the reference-node.

In one or more embodiments the first-attenuation-diode and the second-attenuation-diode are PiN diodes.

In one or more embodiments the attenuation circuit may further comprise an amplifier-inductor connected in series between the connection-node and a supply-node. The amplifier-inductor may be configured to: provide some of the functionality of an amplifier that provides an output signal to the connection-node; and compensate for the off-capacitance of the first- and second-attenuation-diodes.

There is also provided an amplifier circuit comprising:
  a first amplifier that has a first-amplifier-output-terminal;
  any attenuation circuit that is disclosed herein, wherein the connection-node of the attenuation circuit is connected to the first-amplifier-output-terminal; and
  a first-amplifier-inductor connected in series between the connection-node and a supply-node, wherein the first-amplifier-inductor is configured to:

provide some of the functionality of the first amplifier; and compensate for the off-capacitance of the first- and second-attenuation-diodes.

In one or more embodiments the amplifier circuit further comprises:

one or more additional amplifiers connected in series with the first amplifier, wherein each additional amplifier comprises an additional-amplifier-input-terminal and an additional-amplifier-output-terminal;

any attenuation circuit that is disclosed herein connected to the additional-amplifier-output terminal of each of the additional amplifiers except the last additional amplifier in the series; and an amplifier-inductor associated with each of the attenuation circuits, wherein each amplifier-inductor is connected in series between the connection-node of the associated attenuation circuit and the supply-node, wherein the amplifier-inductor is configured to:

provide some of the functionality of the preceding additional amplifier in the series; and compensate for the off-capacitance of the first- and second-attenuation-diodes.

In one or more embodiments the amplifier circuit further comprises an inter-stage matching network connected in series between the connection node of each attenuation circuit and the additional-amplifier-input-terminal of the next additional amplifier in the series.

In one or more embodiments the amplifier circuit further comprises a control signal generator that is configured to provide the first-control-signal and the second-control-signal such that:

the attenuation circuit is in an attenuation mode of operation when the first-control-signal has a higher voltage than the second-control-signal; and the attenuation circuit is in a bypass mode of operation when the first-control-signal has a lower voltage than the second-control-signal.

In one or more embodiments the control signal generator is configured to either:

set the first-control-signal to a supply voltage and set the second-control-signal to a lower reference voltage (such as connected to ground); or set the second-control-signal to a supply voltage and set the first-control-signal to a lower reference voltage (such as connected to ground).

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIG. 2 shows an example embodiment of a 1-bit attenuation circuit;

DETAILED DESCRIPTION

Digital-step-attenuators (DSA) have many applications. One of the key applications is an analog beamformer.

Figure 1A:
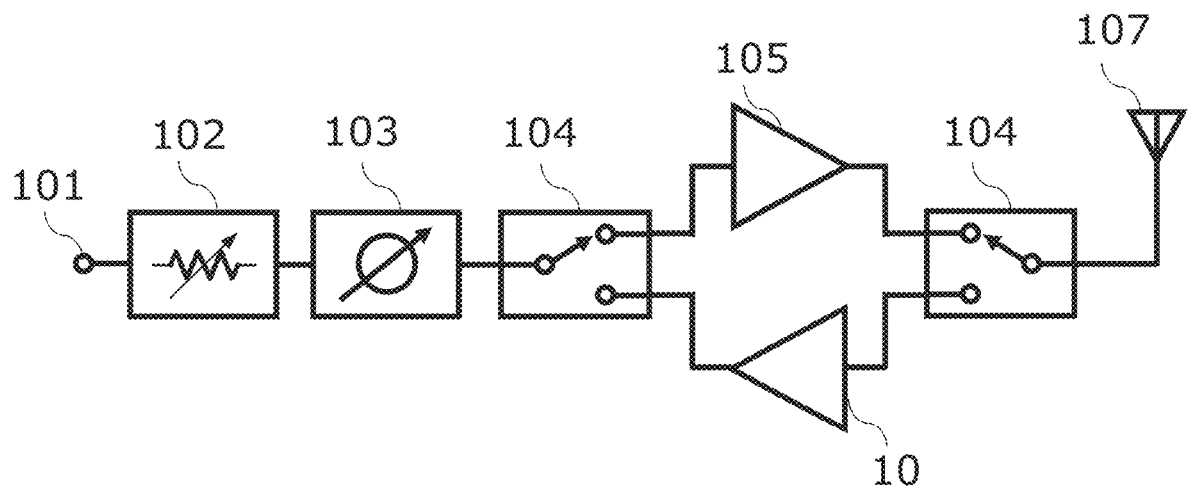
FIGS. 1A and 1B shows block diagrams of one channel in an analog beamformer line up.
Figure 1B:
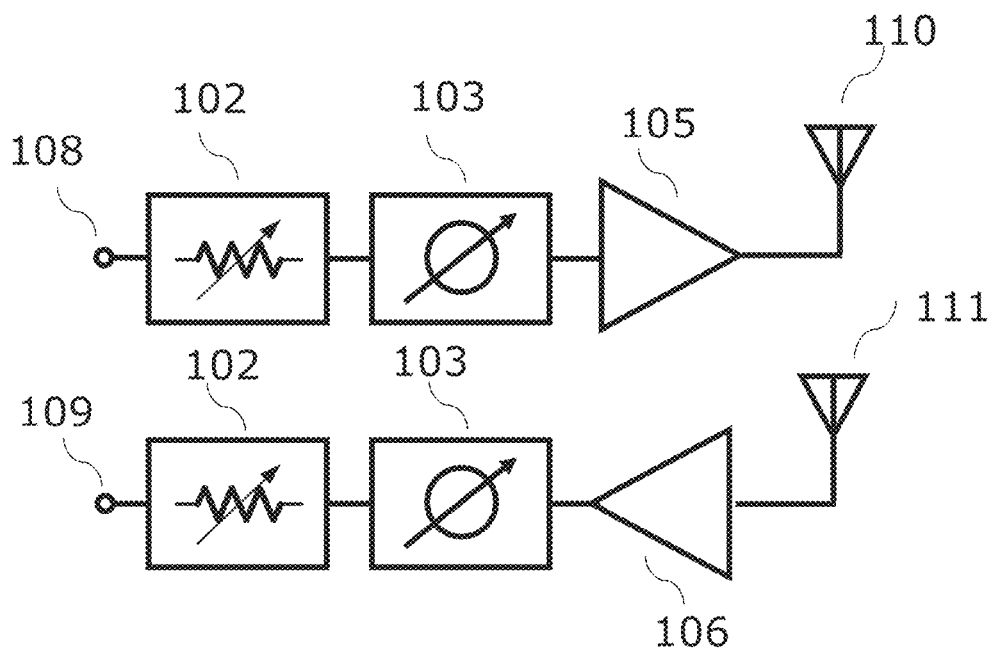

FIGS. 1A and 1B shows block diagrams of one channel in an analog beamformer line up.

FIG. 1A shows a configuration in which the transmitter and the receiver do not work at the same time (e.g. for the application of time division duplex (TDD) communication). FIG. 1A shows a TRX channel input 101, the DSA 102, a phase shifter 103, a single pole double toggle (SPDT) switch 104, a power amplifier (PA) 105 (which can be single or several stages amplifier), a low noise amplifier (LNA) 106 (single or several stages amplifier), and an antenna 107. The positions of the DSA 102 and the phase shifter 103 as they are shown in FIG. 1A can be swapped. The TRX channel input 101 can be connected to a power combiner/splitter for multiple channel operation.

FIG. 1B shows a configuration in which the transmitter and the receiver can work at the same time (e.g. for the application of radar). Components of FIG. 1B that are also in FIG. 1A have been given the same reference numbers. FIG. 1B also shows an input 108 of the transmitter, an output 109 of the receiver, an output antenna 110 of the transmitter, and an input antenna 110 of the receiver.

FIG. 2 shows an example embodiment of a 1-bit attenuation circuit. The attenuation circuit includes a connection-node 212 for connecting to an RF connection, such as an RF input terminal 224 or an RF output terminal 225. Advantageously, the attenuation circuit does not include any components in series in between the RF input terminal 224 and the RF output terminal 225. That is, the attenuation circuit includes only a single connection-node 212 for connecting to the RF connection/transmission line such that the attenuation circuit is in a shunt connection with the RF signal path. In this way, insertion losses and the layout size can be reduced, when compared with a circuit that includes components (such as switches or series capacitors) in series between the RF input terminal 224 and an RF output terminal 225.

As will be described below, the attenuation circuit has an attenuation mode of operation and a bypass mode of operation. In the attenuation mode of operation, the power of the RF signal at the RF connection is attenuated such that the power of the RF signal at the RF output terminal 225 is lower than the power at the RF input terminal 224. In the bypass mode of operation, no significant attenuation occurs such that the power of the RF signal at the RF output terminal 225 is about the same as the power at the RF input terminal 224.

The attenuation circuit includes a first-control-node (V1) 213 that receives a first-control-signal, and also includes a second-control-node (V2) 214 that receives a second-control-signal. As will be discussed below, the first-control-signal and the second-control signal can be provided in order to cause the attenuation circuit to operate in either the attenuation or the bypass mode of operation. The attenuation circuit also includes a reference-node 216 for connecting to a reference terminal. In this example the reference terminal is ground.

The attenuation circuit includes an isolation-capacitor (C3) 217, which is connected in series between the connection-node and an internal-node 215. The isolation-capacitor (C3) 217 can be a large DC decoupling capacitor that prevents any DC components at the RF connection from being passed to the other components of the attenuation circuit.

The attenuation circuit includes: a first-bias-resistor (Rbias) 218 connected in series between the first-control-node (V1) 213 and the internal-node 215; and a second-bias-resistor 219 (Rbias) connected in series between the internal-node 215 and the second-control-node (V2) 214. The presence of the first- and second-bias-resistors 218, 219 is particularly relevant when the attenuation circuit is in the bypass mode of operation, as will be discussed below.

The attenuation circuit also includes: a first-attenuation-diode (D1) 220 connected in series between the first-control-node (V1) 213 and the internal-node 215; and a second-attenuation-diode (D2) 221 connected in series between the internal-node 215 and the second-control-node (V2) 214. The anode of the first-attenuation-diode (D1) 220 is closest to the first-control-node (V1) 213 (in the electrical current flow path between the first-control-node (V1) 213 and the internal-node 215), such that the first-attenuation-diode (D1) 220 is forward biased when the voltage at the first-control-node (V1) 213 is higher than the voltage at the internal-node 215. The anode of the second-attenuation-diode (D2) 221 is closest to the internal-node 215 (in the electrical current flow path between the internal-node 215 and the second-control-node (V2) 214), such that the second-attenuation-diode (D2) 221 is forward biased when the voltage at the internal-node 215 is higher than the voltage at the second-control-node (V2) 214. As will be discussed below, the presence of the first- and second-attenuation-diodes (D1, D2) 220, 221 is particularly relevant when the attenuation circuit is in the attenuation mode of operation. In this example the first- and second-attenuation-diodes (D1, D2) 220, 221 are PiN diodes, although in other examples different types of diodes can be used.

Finally, the attenuation circuit of FIG. 1 includes: a first-decoupling-capacitor (C1) 222 connected in series between the first-control-node (V1) 213 and the reference-node 216; and a second-decoupling-capacitor (C2) 223 connected in series between the second-control-node (V2) 214 and the reference-node 216. The first- and second-decoupling-capacitors (C1, C2) 222, 223 can be large DC decoupling capacitors that prevent any significant AC coupling between the attenuation circuit and the reference-node/ground 216. In this way, the first- and the second-control-nodes (V1, V2) 213, 214 can be considered as "AC ground".

In order to put the attenuation circuit in the bypass mode of operation, the first-control-signal (at the first-control-node (V1) 213) has a lower voltage than the second-control-signal (at the second-control-node (V2) 214). For example, the first-control-node (V1) 213 can be biased with a low voltage such as 0V, and the second-control-node (V2) 214 can be biased with a high voltage such as a supply voltage (Vcc). With such control signals, the first- and second-attenuation-diodes (D1, D2) 220, 221 are reverse biased and turned off. The first- and second-bias-resistors (Rbias) 218, 219 can beneficially assist in ensuring that the voltage at the internal-node is properly biased to (V1+V2)/2 (that is the mid-point between the first- and second-control-signals). The first- and second-bias-resistors (Rbias) 218, 219 can be relatively large (~100 KOhm) such that they can provide the functionality of DC bias resistors. This can be especially useful where the first- and second-attenuation-diodes (D1, D2) 220, 221 are PiN diodes that have very high and sensitive DC resistance when they are in their off state. Furthermore, when the first- and second-attenuation-diodes (D1, D2) 220, 221 are turned off, they have a small capacitance (Coff) and provide a high Ohmic impedance loading at the connection-node 212. Thus, the RF signal directly passes from the RF input terminal 224 to the RF output terminal 225 without any significant attenuation.

In order to put the attenuation circuit in the attenuation mode of operation, the first-control-signal (at the first-control-node (V1) 213) has a higher voltage than the second-control-signal (at the second-control-node (V2) 214). For example, the first-control-node (V1) 213 can be biased with a high voltage such as a supply voltage (Vcc), and the second-control-node (V2) 214 can be biased with a low voltage such as 0V. With such control signals, the first- and second-attenuation-diodes (D1, D2) 220, 221 are forward biased and turned on. The on-resistance (Ron) of the first- and second-attenuation-diodes (D1, D2) 220, 221 sets the loading impedance at the connection-node 212 in order to control the attenuation ratio.

One specification of a DSA is the gain-to-phase error, which means that the output signal (i.e. the RF signal at the RF output terminal 225) should have a constant phase response when switching between the bypass and the attenuation modes of operation. In this example the off-capacitance (Coff) of the first- and second-attenuation-diodes (D1, D2) 220, 221 is sufficiently small such that the gain-to-phase error is acceptable. In other examples, as will discussed below, a tuning-inductor can be used to further improve the gain-to-phase error.

Figure 3:
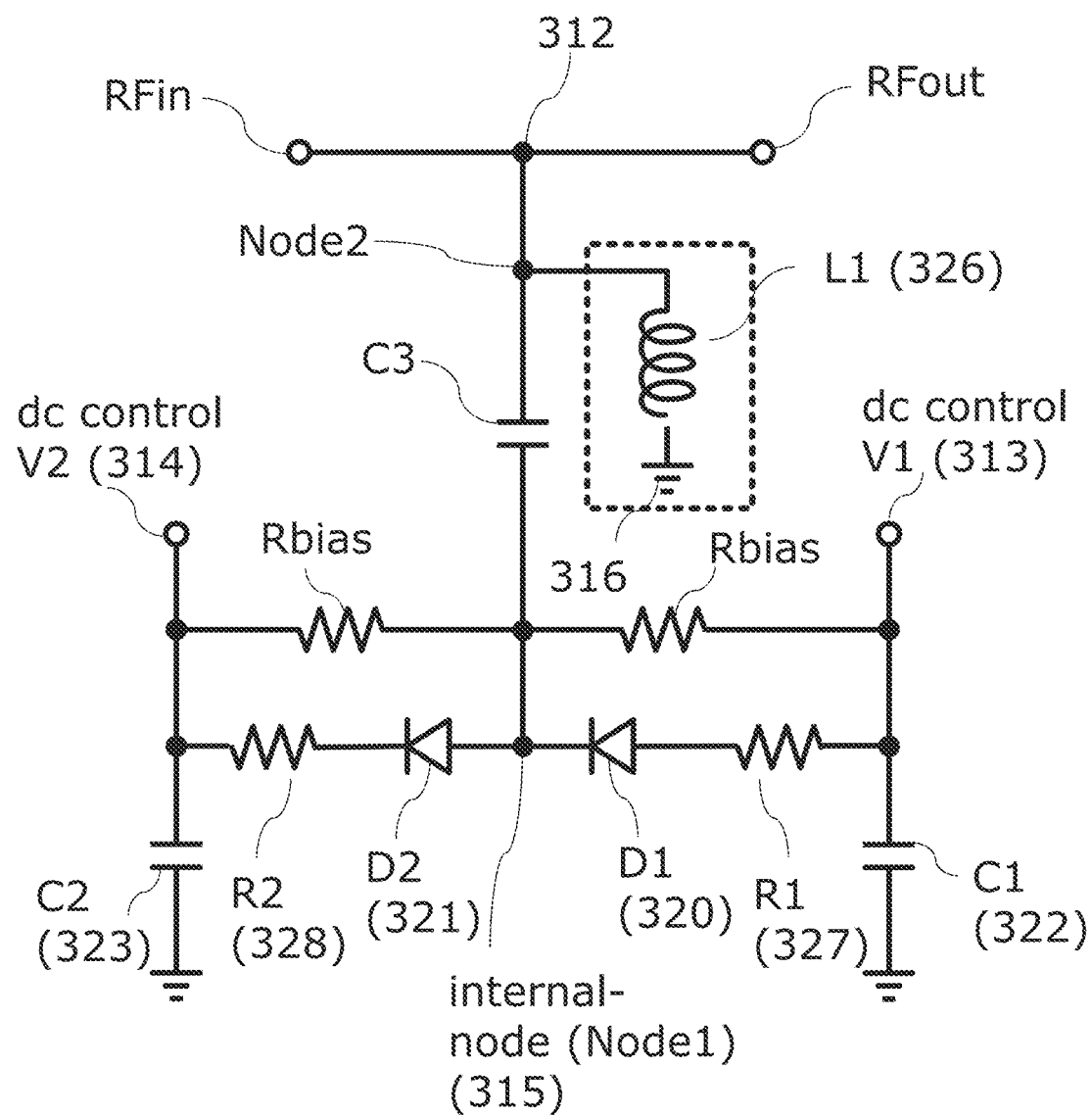
FIG. 3 shows another example embodiment of a 1-bit attenuation circuit.

FIG. 3 shows another example embodiment of a 1-bit attenuation circuit. The circuit of FIG. 3 incldes all of the components of FIG. 2, which have been labelled with corresponding reference numbers in the 300 series.

The attenuation circuit of FIG. 3 also includes a tuning-inductor (L1) 326 connected in series between the connection-node 312 and an AC-reference-node, such as AC ground. In this example the AC-reference-node is the same reference-node 316 to which the first- and second-decoupling-capacitors (C1, C2) 322, 323 are connected, although in other examples the AC-reference-node can be any other reference node such as a supply-node. The tuning-inductor (L1) 326 can also be referred to as a shunt inductor. The tuning-inductor (L1) 326 is used to tune out the off-capacitance (Coff) of the first- and second-attenuation-diodes (D1, D2) 220, 221 and thereby further improve gain-to-phase error. Simulation results that illustrate this improvement in gain-to-phase error are described below.

The attenuation circuit of FIG. 3 also includes a first-attenuation-resistor (R1) 327 and a second-attenuation-resistor (R2) 328. The first-attenuation-resistor (R1) 327 and the first-attenuation-diode (D1) 320 are connected in series with each other between the first-control-node (V1) 313 and the internal-node 315. The second-attenuation-resistor (R2) 328 and the second-attenuation-diode (D2) 321 are connected in series with each other between the internal-node 315 and the second-control-node (V2) 314. The first- and second-attenuation-resistors (R1, R2) 327, 328 combine the on-resistances (Ron) of the first- and second-attenuation-diodes (D1, D2) 320, 321 to set the loading impedance at the connection-node 312, as discussed below with reference to equations 1 to 5.

In this example, the first-attenuation-resistor (R1) 327 and the first-attenuation-diode (D1) 320 are connected in series with each other, in that order, between the first-control-node (V1) 313 and the internal-node 315. A first terminal of the first-attenuation-resistor (R1) 327 is connected to the first-control-node (V1) 313. A second terminal of the first-attenuation-resistor (R1) 327 is connected to the anode of the first-attenuation-diode (D1) 320. The cathode of the first-attenuation-diode (D1) 320 is connected to the internal-node 315. It will be appreciated that in some examples each of these connections can be indirect connections, in that one or more intermediate components can be provided between the connections without preventing the desired functionality of the attenuation circuit. Either way, the first-attenuation-diode (D1) 320 is closer to the internal-node 315 than the first-attenuation-resistor (R1) in this example.

Similarly, in this example the second-attenuation-diode (D2) 321 and the second-attenuation-resistor (R2) 328 are connected in series with each other, in that order, between the internal-node 315 and the second-control-node (V2) 314. The anode of the second-attenuation-diode (D2) 321 is connected to the internal-node 315. The cathode of the second-attenuation-diode (D2) 321 is connected to a first terminal of the second-attenuation-resistor (R2) 328. A second terminal of the second-attenuation-resistor (R2) 328 is connected to the second-control-node (V2) 314. Again, in some examples each of these connections can be indirect connections. Either way, the second-attenuation-diode (D2) 321 is closer to the internal-node 315 than the second-attenuation-resistor (R2) 328 in this example.

It has been found that putting the first- and second-attenuation-diodes (D1, D2) 320, 321 in the center of the attenuation circuit (i.e. closer to the internal-node 315 than the respective first- and second-attenuation-resistors (R1, R2) 327, 328) as shown in FIG. 3 can achieve lower gain-to-phase errors than putting first- and second-attenuation-resistors (R1, R2) 327, 328 in the center. This has been proven by simulation, as will be discussed below. The reason is that when switching the first- and second-attenuation-diodes (D1, D2) 320, 321 between the ON and OFF state, the substrate capacitance change compensates the junction capacitance change.

Figure 4A:
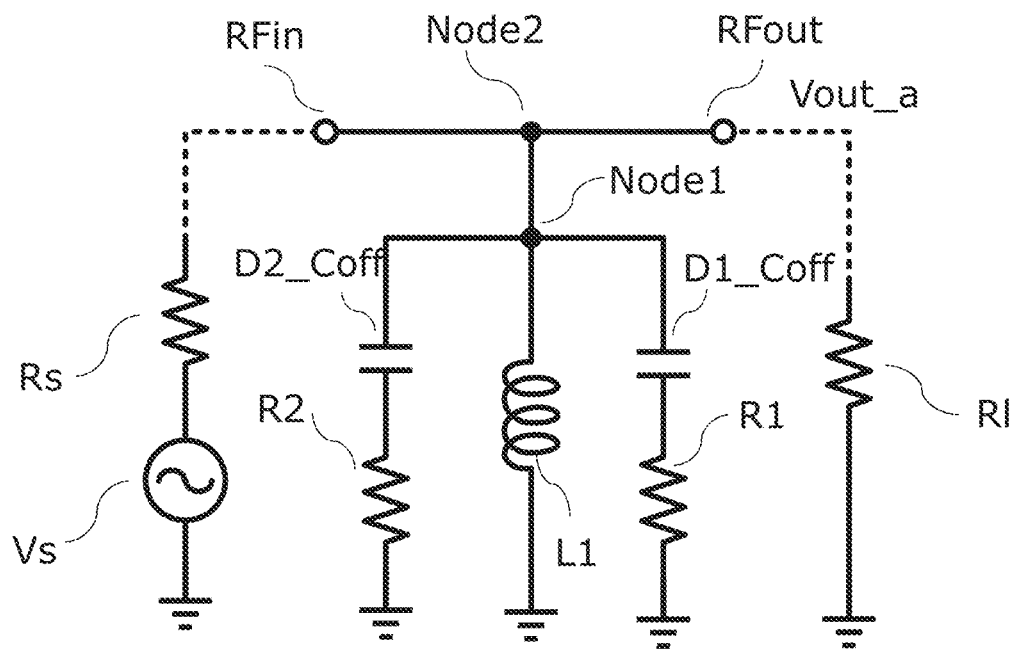
FIGS. 4A and 4B show small-signal models of the 1-bit DSA in FIG. 3.
Figure 4B:
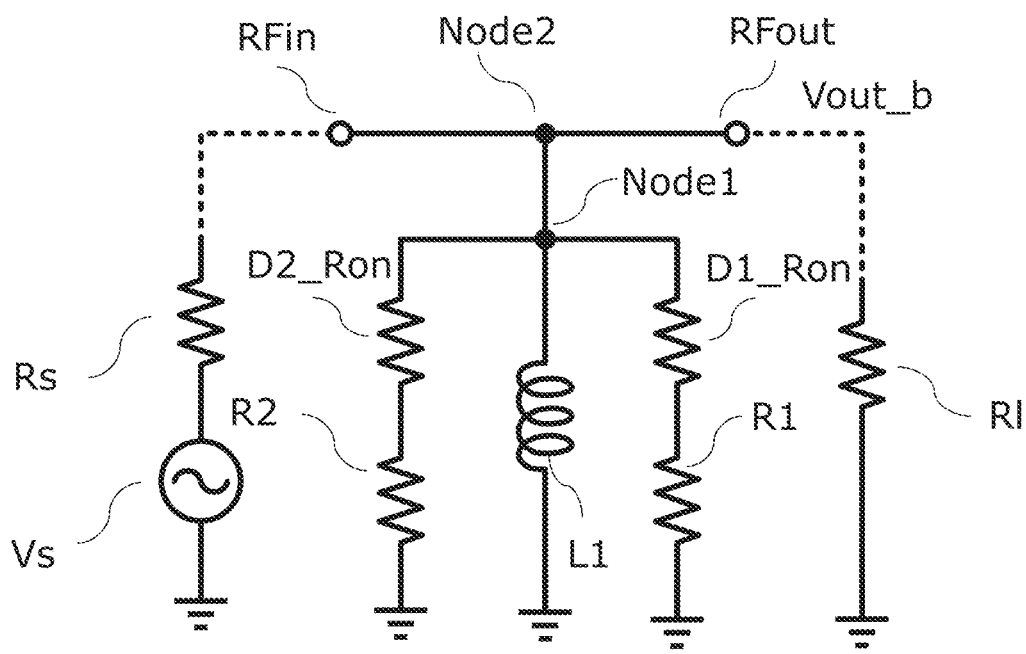

FIGS. 4A and 4B show small-signal models of the 1-bit DSA in FIG. 3. FIG. 4A refers to the attenuation circuit in the bypass mode of operation. FIG. 4B refers to the attenuation circuit in the attenuation mode of operation. We will use these models to calculate the required value of the tuning-inductor (L1) and attenuation ratio expressions. Each of the components in FIGS. 4A and 4B have been given labels that are either used in FIG. 3 or referred to in the above description of FIG. 3. Since C1, C2 and C3 are large DC decoupling capacitors, they are treated as short RF connections. Since the Rbias resistors are large DC bias resistors, they are treated as open RF connections. Rs is the source resistance, RI is the load resistance, and the voltage at the RF input terminal is modelled as a supply voltage Vs.

To simplify the mathematical calculations, we assume Rs=RI=Z0, R1=R2=R0, D2_Coff=D1_Coff=Coff, D2_Ron=D1_Ron=Ron.

Output voltage of bypass mode in FIG. 3(a) is:

$$V_{out\_a} = V_S - \frac{V_S \cdot Z_0}{Z_0 + \cfrac{1}{\cfrac{2}{R_0 + \cfrac{1}{j\omega C_{off}}} + \cfrac{1}{j\omega L_1} + \cfrac{1}{Z_0}}} \quad \text{Equation 1}$$

In which w=2*pi*fc, fc is the center of operational frequency.

Output voltage of by-pass mode in FIG. 3(b) is:

$$V_{out\_b} = V_S - \frac{V_S \cdot Z_0}{Z_0 + \cfrac{1}{\cfrac{2}{R_0 + R_{on}} + \cfrac{1}{j\omega L_1} + \cfrac{1}{Z_0}}} \quad \text{Equation 2}$$

In order to get the same phase between Vout_a and Vout_b, we have:

$$\frac{\text{real}(V_{out\_a})}{\text{imag}(V_{out\_a})} = \frac{\text{real}(V_{out\_b})}{\text{imag}(V_{out\_b})} \quad \text{Equation 3}$$

Hence, after simplifying the equations 1-3, we have:

$$L_1 = \frac{Z_0}{2\omega^2 C_{off}} \left( \frac{1 - \omega^2 C_{off}^2 R_0 R_{on}}{R_{on} + R_0 + Z_0} \right) \quad \text{Equation 4}$$

It means that given a certain diode size (Ron, Coff), attenuation resistance (R1, R2) and frequency, there is one corresponding shunt inductance L1 for zero gain-to-phase error (i.e. for which the phase is the same for bypass mode and attenuation mode).

Since Vout_a and Vout_b have the same phase, we can also get the attenuation ratio as:

$$\text{ATT\_ratio} = \frac{\text{real}(V_{out\_a})}{\text{real}(V_{out\_b})} = \frac{1+(\omega R_0 C_{off})^2}{1+(\omega R_0 C_{off})^2\left(1+\frac{Z_0}{R_0}\right)}\left(1+\frac{Z_0}{R_0+R_{on}}\right) \quad \text{Equation 5}$$

Intuitively speaking, the attenuation ratio is monotonically increasing with R0 increasing. When R0=0, we get maximum attenuation ratio of 1+Z0/Ron. When R0=+∞, we get minimum attenuation ratio of 1 (0 dB).

Figure 5A:
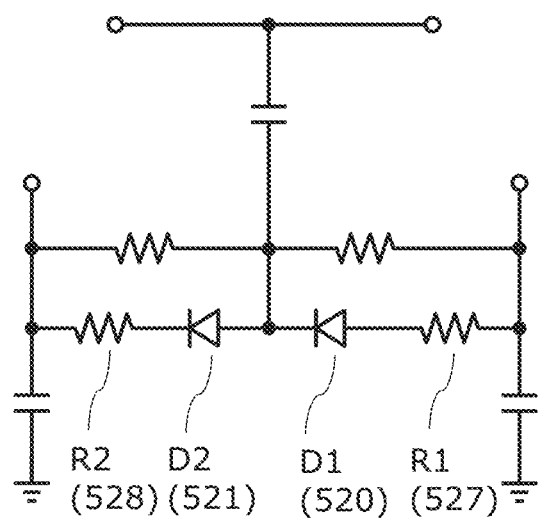
FIG. 5A shows an attenuation circuit that is similar to that of FIG. 3, but without the tuning-inductor.
Figure 5B:
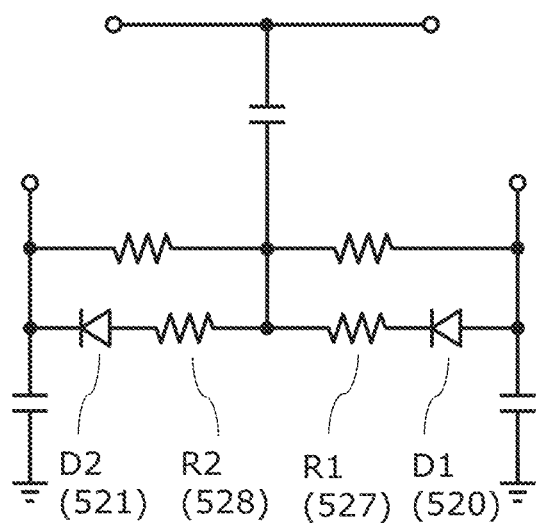
FIG. 5B shows an attenuation circuit that is similar to that of FIG. 5A, but with: the positions of the first-attenuation-resistor and the first-attenuation-diode reversed; and the positions of the second-attenuation-resistor and the second-attenuation-diode reversed.

FIG. 5A shows an attenuation circuit that is similar to that of FIG. 3, but without the tuning-inductor. FIG. 5B shows an attenuation circuit that is similar to that of FIG. 5A, but with: the positions of the first-attenuation-resistor (R1) 527 and the first-attenuation-diode (D1) 520 reversed; and the positions of the second-attenuation-resistor (R2) 528 and the second-attenuation-diode (D2) 521 reversed. The circuits of FIGS. 5A and 5B have the same values for all components.

Figure 5C:
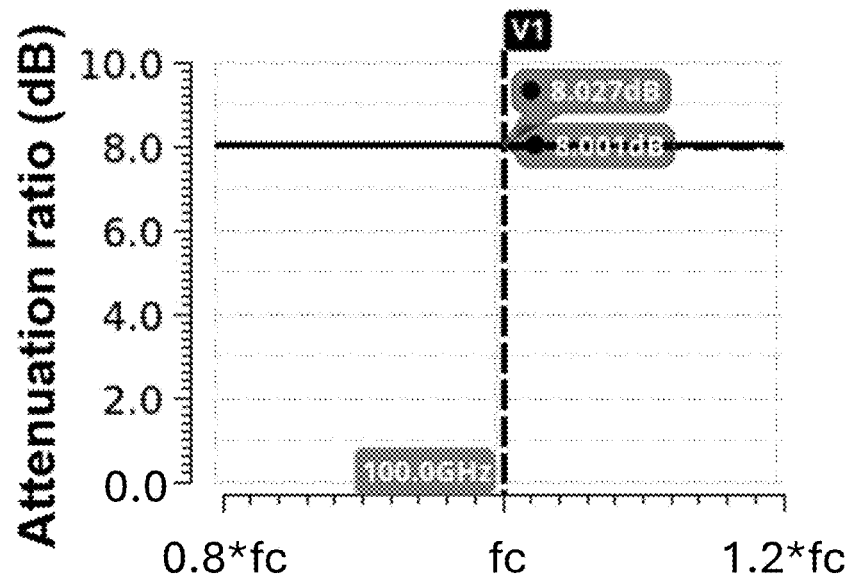
FIG. 5C shows the simulated attenuation ratio (dB) versus frequency for the attenuation circuit of FIG. 5A and the attenuation circuit of FIG. 5B.

FIG. 5C shows the simulated attenuation ratio (dB) versus frequency for: the attenuation circuit of FIG. 5A as a solid line, and the attenuation circuit of FIG. 5B as a (horizontal) dashed line. FIG. 5C shows that both attenuation circuits achieve an attenuation ratio of 8 dB at the centre frequency.

Figure 5D:
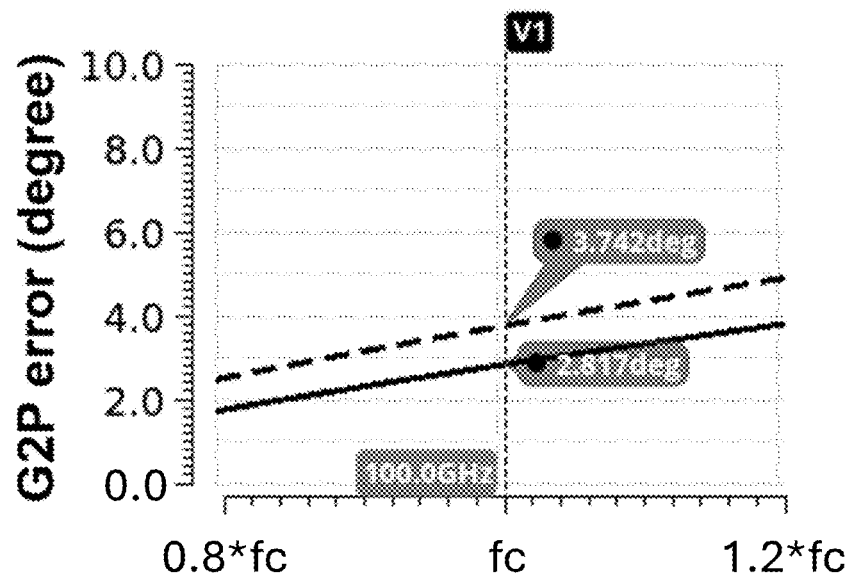
FIG. 5D shows the simulated gain-to-phase (G2P) error in degrees versus frequency for the attenuation circuit of FIG. 5A and the attenuation circuit of FIG. 5B.

FIG. 5D shows the simulated gain-to-phase (G2P) error in degrees versus frequency for: the attenuation circuit of FIG. 5A as a solid line, and the attenuation circuit of FIG. 5B as a dashed line. FIG. 5D shows that the G2P error of the attenuation circuit of FIG. 5A at the centre frequency (having a value of 2.817 degrees) than is better than the G2P error of the attenuation circuit of FIG. 5B at the centre frequency (having a value of 3.742 degrees).

Therefore, FIG. 5D shows that the arrangement of diodes and attenuation resistors in FIG. 5A achieves a better gain-to-phase error than the arrangement in FIG. 5B.

Figure 6A:
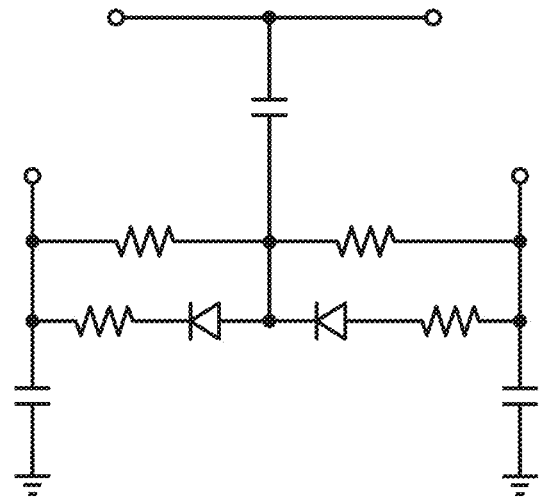
FIG. 6A shows an attenuation circuit that is similar to that of FIG. 3, but without the tuning-inductor.
Figure 6B:
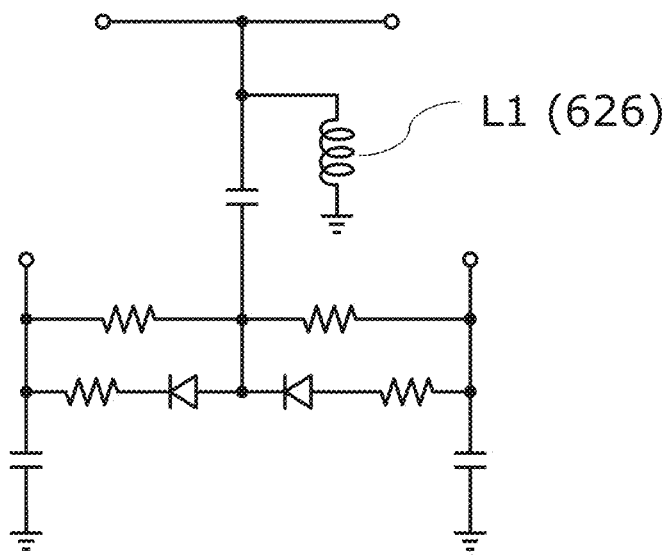
FIG. 6B shows the same attenuation circuit as that of FIG. 3 (i.e. with the tuning-inductor)

FIG. 6A shows an attenuation circuit that is similar to that of FIG. 3, but without the tuning-inductor. FIG. 6B shows the same attenuation circuit as that of FIG. 3 (i.e. with the tuning-inductor 626). The circuits of FIGS. 6A and 6B have the same values for all components.

Figure 6C:
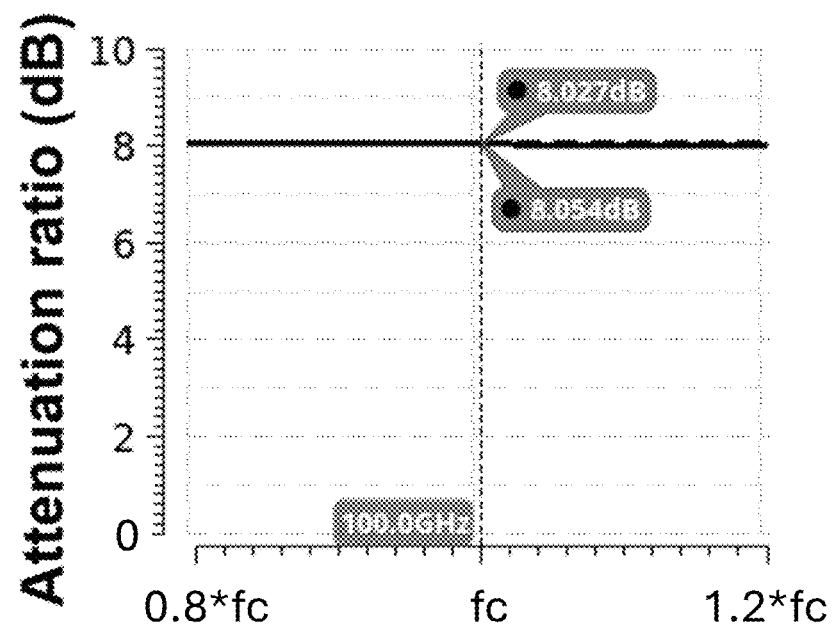
FIG. 6C shows the simulated attenuation ratio (dB) versus frequency for the attenuation circuit of FIG. 6A and the attenuation circuit of FIG. 6B.

FIG. 6C shows the simulated attenuation ratio (dB) versus frequency for: the attenuation circuit of FIG. 6A as a solid line, and the attenuation circuit of FIG. 6B as a (horizontal) dashed line. FIG. 6C shows that both attenuation circuits achieve an attenuation ratio of 8 dB at the centre frequency.

Figure 6D:
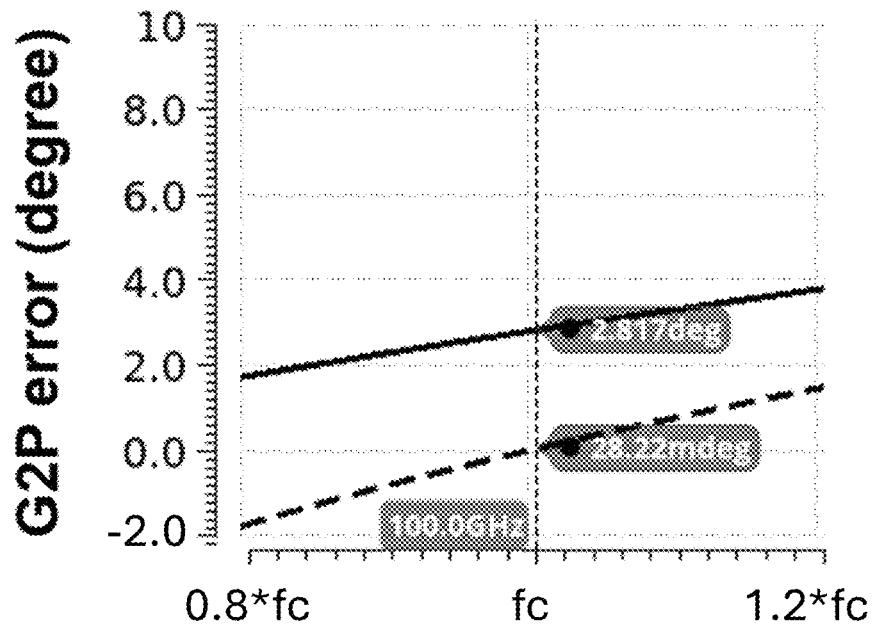
FIG. 6D shows the simulated gain-to-phase (G2P) error in degrees versus frequency for the attenuation circuit of FIG. 6A and the attenuation circuit of FIG. 6B.

FIG. 6D shows the simulated gain-to-phase (G2P) error in degrees versus frequency for: the attenuation circuit of FIG. 6A as a solid line, and the attenuation circuit of FIG. 6B as a dashed line. FIG. 6D shows that the G2P error of the attenuation circuit of FIG. 6B at the centre frequency (having a value of 0.02822 degrees) than is better than the G2P error of the attenuation circuit of FIG. 6A at the centre frequency (having a value of 2.817 degrees). That is, inclusion of the tuning-inductor (L1) 626 of FIG. 6B completely compensates the G2P error at the center frequency. Nonetheless, as indicated above in some cases it can still be possible to meet a system specification for G2P error without the tuning-inductor.

Figure 7:
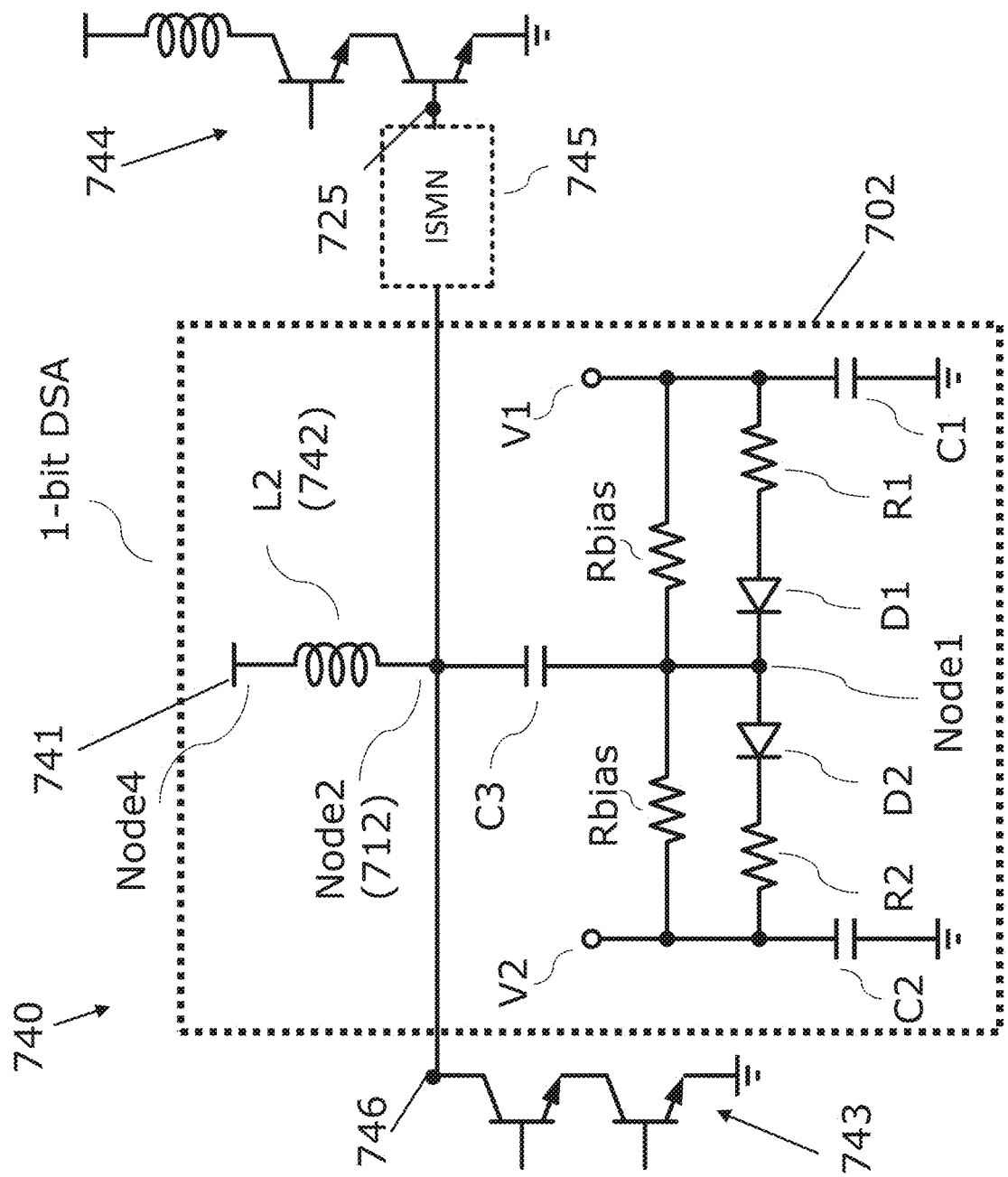
FIG. 7 shows an example embodiment of an amplifier circuit that includes a 1-bit digital signal attenuation circuit.

FIG. 7 shows an example embodiment of an amplifier circuit 740 that includes a 1-bit digital signal attenuation circuit 702. Components of the attenuation circuit 702 that have already been described with reference to an earlier drawing will not necessarily be described again here.

In this example, the attenuation circuit 702 includes an amplifier-inductor (L2) 742 connected in series between the connection-node 712 and a supply-node 741. The amplifier-inductor 742 reduces the gain-to-phase error of the attenuation circuit 702 by compensating for the off-capacitance of the first- and second-attenuation-diodes (D1, D2). Therefore the amplifier-inductor 742 can be considered as an example of the tuning-inductor that is described above with reference to FIG. 3, and the supply-node can be considered as an example of the AC-reference-node. In addition, as will be described below, the amplifier-inductor (L2) provides some of the functionality of an amplifier 743 that provides an output signal to the connection-node 712.

FIG. 7 shows how the 1-bit DSA circuit 702 is integrated between two amplifiers—a first amplifier 743 and a second amplifier 744.

The first amplifier 743 that has a first-amplifier-output-terminal 746, which is connected to the connection-node 712 of the attenuator circuit 702. The components of the first amplifier 743 that are outside (to the left of) the attenuation circuit 702 in FIG. 7 can be considered as a unit cell of an amplifier. In FIG. 7 the unit cell is illustrated as a cascode stage, although it will be appreciated that in other examples the unit cell can be provided as a common-emitter, common-base, common-source, common-gate or any other amplifier unit cell configuration.

An RF amplifier (such as the first amplifier 743) usually has a parallel inductor between the first-amplifier-output-terminal 746 and a supply-node 741 (which can also be consider as an AC ground node). Advantageously, in FIG. 7 the functionality of the tuning-inductor of the attenuation circuit 702 and the functionality of the parallel inductor of the RF amplifier is combined and provided by a single component: the amplifier-inductor (L2) 742. As shown in FIG. 7, the amplifier-inductor (L2) 742 can provide both functionalities at the same time. Therefore, amplifier circuit 740 of FIG. 7 has less components than would be the case if the inductors were implemented separately, and advantageously a more compact layout size can be achieved with lower insertion loss.

The second amplifier 744 has a second-amplifier-input-terminal 725. The second-amplifier-input-terminal 725 is connected to the connection-node 712, and therefore is also connected to the first-amplifier-output-terminal 746.

In this example, an ISMN (inter-stage-matching-network) 745 is connected in series between the connection-node 712 and the second-amplifier-input-terminal 725. The ISMN 745 is used to transform the input impedance of the sconed amplifier 744 to the optimal load impedance of the first amplifier 743. In general, the input impedance of the second amplifier 744 is likely to be lower than the load impedance of the first amplifier 743. From equation 5 above, we see that an increasing Z0 will increase the attenuation ratio. Thus, positioning the connection-node 712 between the first-amplifier-output-terminal 746 and the ISMN 745 can provide better performance than positioning the connection-node 712 between the ISMN 745 and the second amplifier 744.

As will be discussed below, an amplifier circuit according to the present disclosure can include a plurality of amplifiers connected in series, with any of the attenuator circuits disclosed herein connected to an RF connection between amplifiers.

Figure 8:
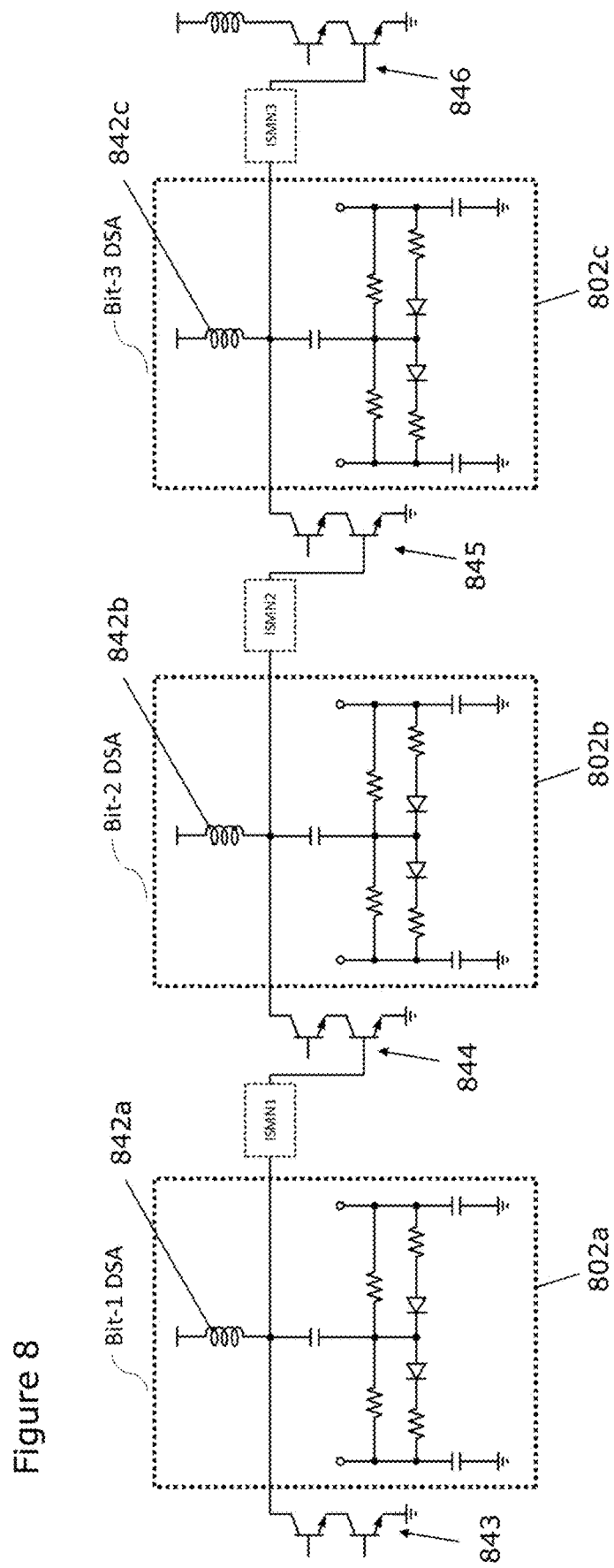
FIG. 8 shows an example embodiment of a multiple-bit attenuation circuit (DSA) line-up configuration.

FIG. 8 shows an example embodiment of a multiple-bit attenuation circuit (DSA) line-up configuration. Just as an example, Bits 1, 2, 3 of the DSA are set for attenuation control of 1, 2, 4 dB, respectively. Therefore, in total an attenuation range of 0-7 dB can be achieved. It will be appreciated that the functionality of FIG. 8 can be used with any number of bits.

As shown in FIG. 8, an amplifier 844, 845 is positioned between each DSA stage 802a, 802b, 802c in order to improve an attenuation step error (to decrease glitches between attenuation state transitions). A potential issue of cascading DSA stages/cores 802a, 802b 802c without any amplifiers is that a 1-bit DSA will provide a different interface impedance between the bypass mode and the attenuation mode of operation, and consequently can impact the operation of other "neighborhood" DSA stages. Adding an amplifier 844, 845 between each DSA stage/core 802a, 802b 802c can beneficially isolate this impedance change and ensure each DSA stage/core 802a, 802b 802c is working independently. This approach can significantly improve the attenuation step error.

In this way, an amplifier circuit can be provided that includes a first amplifier 843 and one or more additional amplifiers 844, 845, 846 connected in series with the first amplifier 843. Each additional amplifier 844, 845, 846 comprises an additional-amplifier-input-terminal and an additional-amplifier-output-terminal. The amplifier circuit further including an attenuation circuit 802a, 802b, 802c connected to the additional-amplifier-output terminal of each of the additional amplifiers 844, 845 except the last additional amplifier 846 in the series. Further still, the amplifier circuit can include an amplifier-inductor 842a, 842b, 842c associated with each of the attenuation circuits 802a, 802b, 802c. Each amplifier-inductor 842a, 842b, 842c is connected in series between the connection-node of the associated attenuation circuit 802a, 802b, 802c and the supply-node. As discussed above, each amplifier-inductor 842a, 842b, 842c is configured to: provide some of the functionality of the preceding additional amplifier 843, 844, 845 in the series; and compensate for the off-capacitance of the first- and second-attenuation-diodes (D1, D2). Yet further, as shown in FIG. 8, the amplifier circuit can include an inter-stage matching network (ISMN) connected in series between the connection node of each attenuation circuit and the additional-amplifier-input-terminal of the next additional amplifier in the series.

Figure 9A:
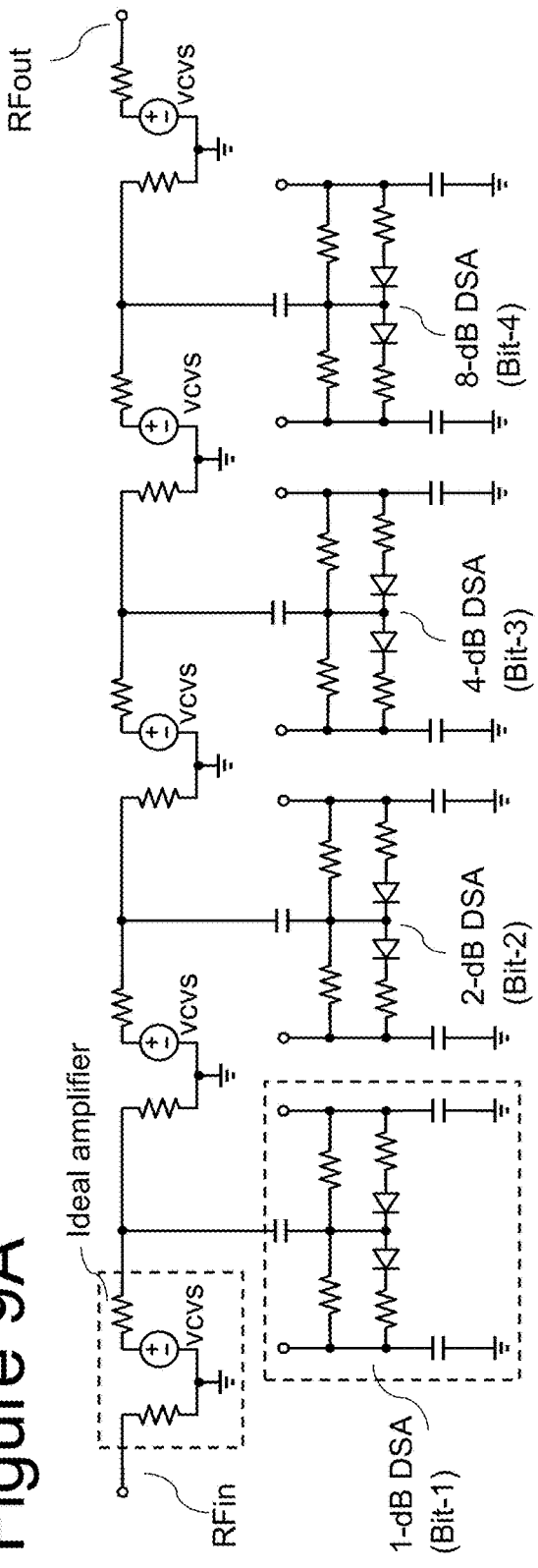
FIGS. 9A and 9B show simulation results of the amplifier circuit of FIG. 8.
Figure 9B:
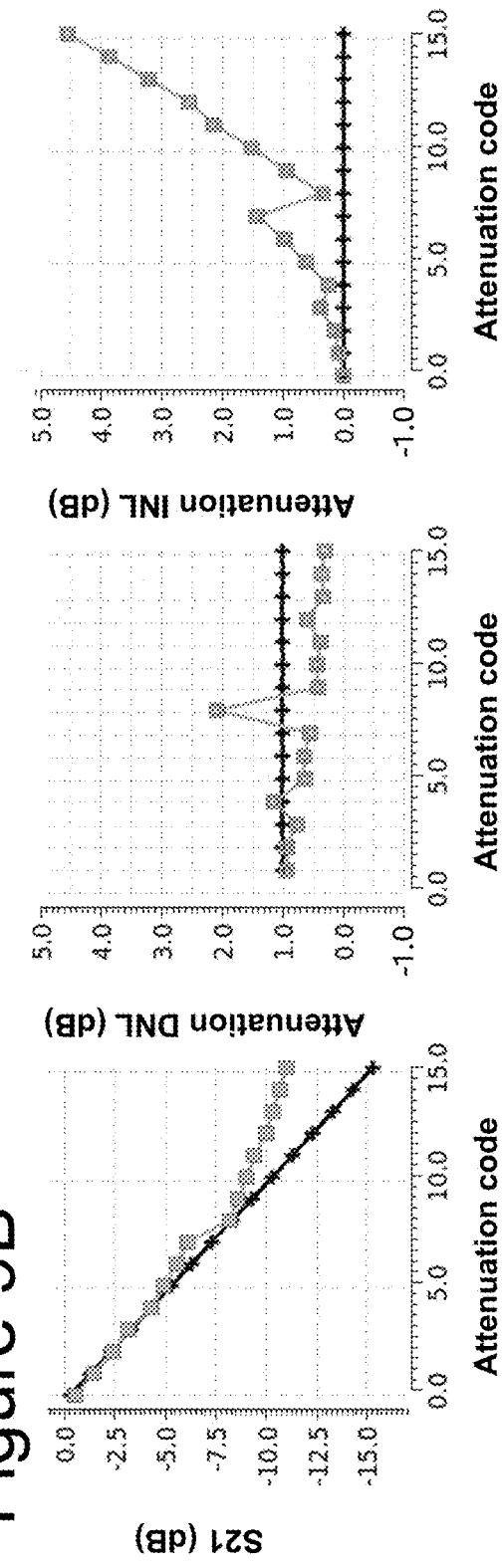

FIGS. 9A and 9B show simulation results of the amplifier circuit of FIG. 8, and more particularly to show that a gain step error (glitch) will be improved by adding amplifiers to isolate each DSA core.

FIG. 9A shows a schematic of the test bench that was used for the simulation. In order to simplify the simulation, a voltage-control-voltage-source (vcvs) with 50-Ohm resistor was used to represent ideal amplifiers. The attenuator line-up includes 4 DSA cores with 1, 2, 4, 8 dB attenuation ratios, respectively. Thus, the line-up has 15-dB attenuation range with each attenuation step of 1 dB.

FIG. 9B shows the simulation results. The darker lines (with crosses) relate to the performance of FIG. 9A. The lighter lines (with squares) relate to the case that all the ideal amplifiers are removed in FIG. 9A. The first plot relates to S21 (the gain from the input to the output). The second plot relates to attenuation DNL (differential non-linearity). The third plot relates to attenuation INL (integral non-linearity). Attenuation DNL is defined by the delta gain between each attenuation state and ideally is equal to 1 dB. Attenuation INL is defined by the gain error between the target (each step with ideal attenuation of 1 dB) and is ideally equal to 0 dB.

It can be seen from FIG. 9 that the darker lines (with the crosses) are close to an ideal attenuator case, while the lighter lines (with the squares) have quite some glitches between each attenuation state transition. To be more specific, if we look at the INL of the lighter lines, only with attenuator code 1, 2, 4, 8 INL is close to 0 dB because with these states only one DSA core is turned on (i.e. the other DSA cores are turned off). With the other attenuator codes, at least two DSA cores are turned on at the same time and the DSA cores interface impedance change will impact the operation of the others. This is the root cause of the glitches in the lighter lines.

Figure 10:
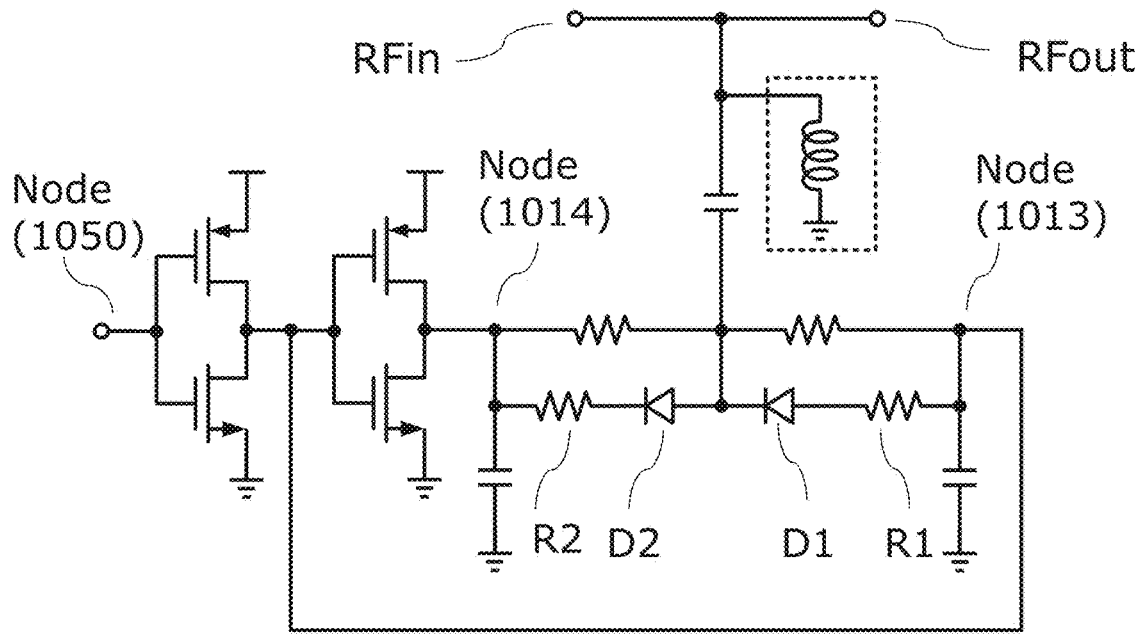
FIG. 10 shows an embodiment of an attenuation circuit that includes an example circuit design of a control signal generator for providing the first- and the second-control-signals.

FIG. 10 shows an embodiment of an attenuation circuit that includes an example circuit design of a control signal generator for providing the first- and the second-control-signals that are described above for setting the mode of operation of the attenuation circuit. The control signal generator can also be referred to as one or more bias circuits for DC control of V1 and V2 (as they are shown in FIGS. 2 and 3).

FIG. 10 shows a straightforward way of using a voltage-controlled bias circuit for 1-bit DSA. A DC control input is provided at a control-node 1050 and invertors are provided to create 0 V and Vcc bias voltages.

In the bypass mode, the control-node 1050 is at the supply voltage (Vcc). Invertors provide Vcc at the second-control-node (V2) 1014, and 0 V at the first-control-node (V1) 1013, respectively. Thus, PiN diodes D1 and D2 are reverse-biased and turned off.

In the attenuation mode, the control-node 1050 is at 0 V. Invertors provide 0 V at the second-control-node (V2) 1014, and Vcc at the first-control-node (V1) 1013, respectively. Thus, PiN diodes D1 and D2 are forward-biased and turned on.

However, with the voltage-controlled bias circuit of FIG. 10, the bias current of D1 and D2 are dependent on the attenuation resistors R1 and R2. Current consumption of a DSA core therefore cannot be accurately controlled.

Figure 11:
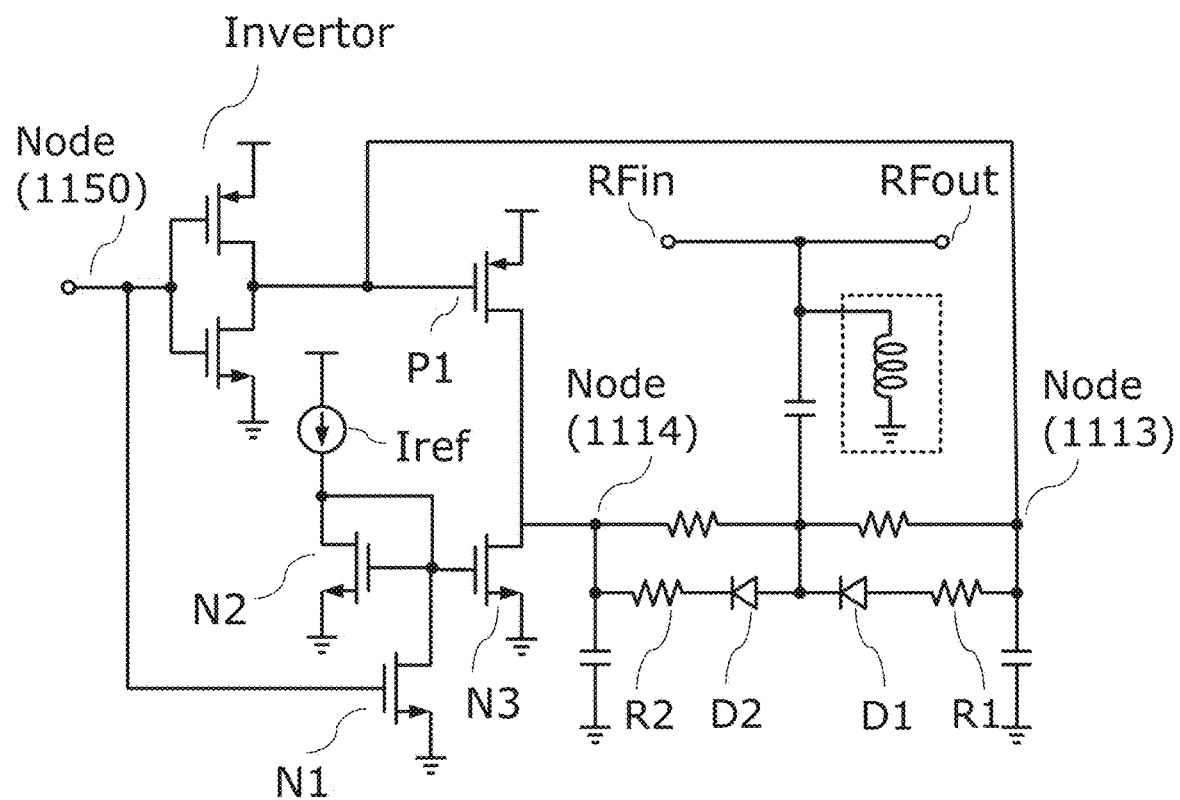
FIG. 11 illustrates a current-controlled bias circuit for providing the first- and the second-control-signals.

FIG. 11 illustrates a current-controlled bias circuit for providing the first- and the second-control-signals. More particularly, it shows a schematic of a 1-bit DSA with a bottom current-controlled bias circuit. The motivation of this bias circuit is to accurately control the DC bias current of PiN diodes in ON stage (attenuation mode).

In the bypass mode, a control-node 1150 input is Vcc. N1 has the gate voltage of Vcc, N1 is turned on and pull down the gate voltage of N3 to 0 V, and N3 is turned off (as "open"). Invertor provides 0 V bias at the first-control-node (V1) 1113. Since the gate voltage of P1 is 0 V, P1 is turned on and the second-control-node (V2) 1114 is biased to Vcc. Hence, PiN diodes D1 and D2 are reverse biased and turned off.

In the attenuation mode, the control-node 1150 input is 0 V. Since N1 has gate voltage of 0 V, N1 is turned off and does not impact other transistors operation. N2 and N3 work as a normal current mirror at the bottom of the second-control-node (V2) 1114. Invertor provides Vcc bias at the first-control-node (V1) 1113. Since the gate voltage of P1 is Vcc, P1 is turned off (as "open"). Hence, PiN diodes D1 and D2 are forward-biased. The bias current of PiN diode is the same as the drain current of N3 and accurately controlled by the current mirror N2, N3 and Iref.

Figure 12:
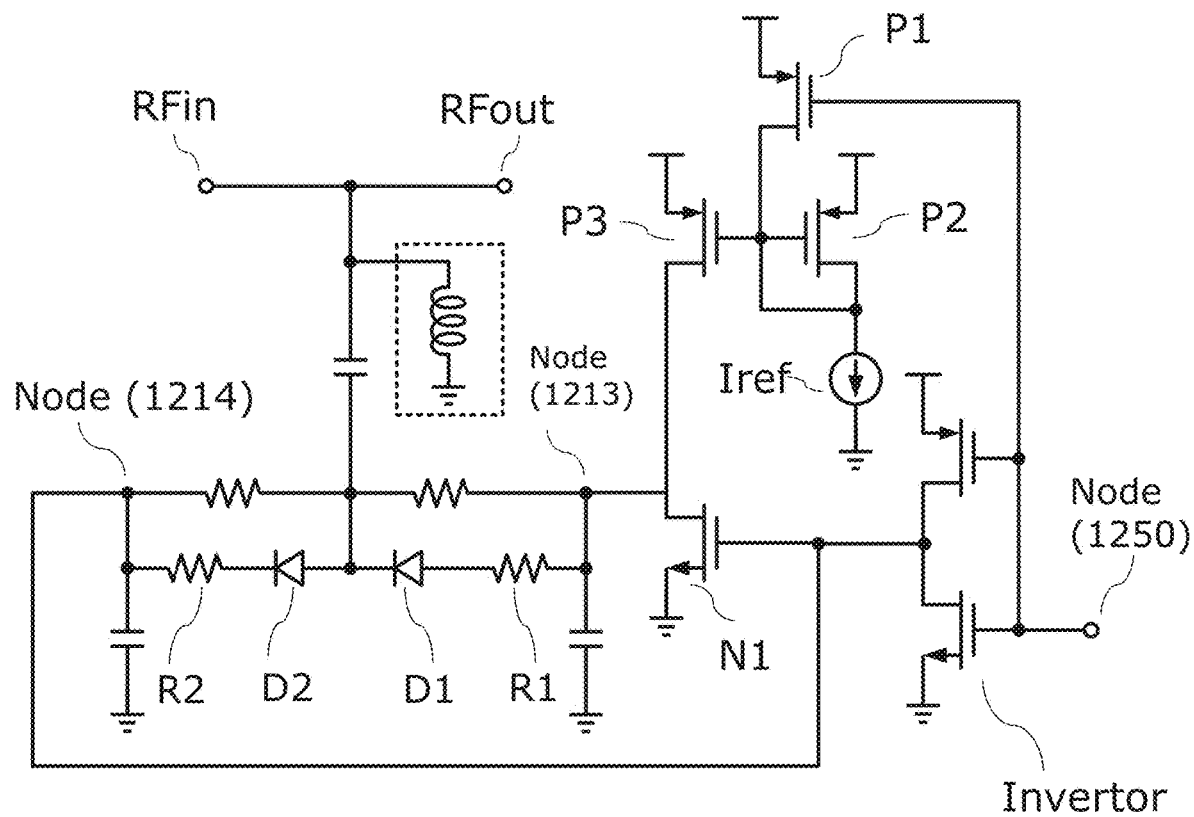
FIG. 12 shows an example schematic of a 1-bit DSA with a top current-controlled bias circuit.

FIG. 12 shows an example schematic of a 1-bit DSA with a top current-controlled bias circuit. FIG. 12 is similar to FIG. 11, the main difference is that FIG. 11 uses an NMOS current mirror at the bottom of attenuator core to provide bias current, while FIG. 12 uses a PMOS current mirror at the top of attenuator core to provide bias current.

In the bypass mode, the control-node 1250 input is 0 V. Since P1 has the gate voltage of 0 V, P1 is turned on and pull up the gate voltage of P3 to Vcc, and P3 is turned off (as "open"). Invertor provides Vcc bias at the second-control-node (V2) 1214. Since the gate voltage of N1 is Vcc, N1 is turned on and it pulls down the bias voltage at the first-control-node (V1) 1113 to 0 V. Hence, PiN diodes D1 and D2 are reverse biased and turned off.

In the attenuation mode, the control-node 1250 input is Vcc. Since P1 has the gate voltage of Vcc, P1 is turned off and does not impact other transistors operation. P2 and P3 work as a normal current mirror at the top of the first-control-node (V1) 1213. Invertor provides 0 V bias at the second-control-node (V2) 1214. Since the gate voltage of N1 is 0 V, N1 is turned off (as "open"). Hence, PiN diodes D1 and D2 are forward-biased. The bias current of PiN diode is the same as the drain current of P3 and accurately controlled by the current mirror P2, P3 and Iref.

Figure 13:
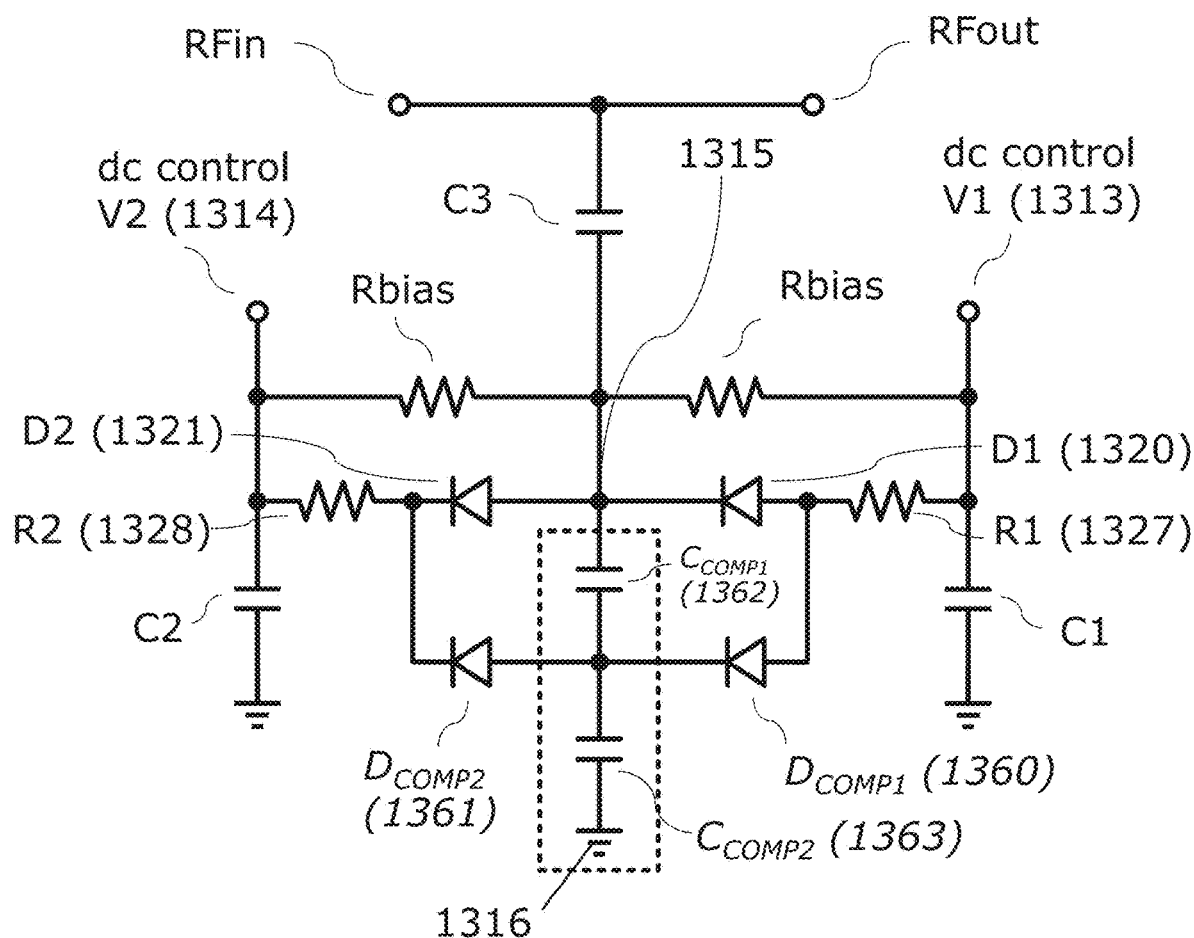
FIG. 13 shows another example embodiment of an attenuation circuit.

FIG. 13 shows another example embodiment of an attenuation circuit. Components that are also shown in FIG. 2 are given corresponding reference numbers in the 1300 series and will not necessarily be described again here. The circuit of FIG. 13 is a 1-bit DSA core with an extra diode branch (which may include PiN diodes in some examples) for wide-band G2P compensation.

In addition to the components of FIG. 2, the attenuation circuit of FIG. 13 includes:
a first-attenuation-resistor (R1) 1372 having a first terminal and a second terminal;
a second-attenuation-resistor (R2) 1328 having a first terminal and a second terminal;
a first-compensation-diode ($D_{COMP1}$) 1360 having an anode-terminal and a cathode-terminal; and
a second-compensation-diode ($D_{COMP2}$) 1361 having an anode-terminal and a cathode-terminal.

The first-terminal of the first-resistor (R1) 1327 is connected to the first-control-node (V1) 1313. The second-terminal of the first-resistor (R1) 1327 is connected to the anode-terminal of the first-attenuation-diode (D1) 1320. The cathode-terminal of the first-attenuation-diode (D1) 1320 is connected to the internal-node 1315. The anode-terminal of the second-attenuation-diode (D2) 1321 is connected to the internal-node 1315. The cathode-terminal of the second-attenuation-diode (D2) 1321 is connected to the first-terminal of the second-attenuation-resistor (R2) 1328. The second-terminal of the second-attenuation-resistor (R2) 1328 is connected to the second-control-node (V2) 1314. The anode-terminal of the first-compensation-diode ($D_{COMP1}$) 1360 is connected to the second-terminal of the first-resistor (R1) 1327. The cathode-terminal of the first-compensation-diode ($D_{COMP1}$) 1360 is connected to the anode-terminal of the second-compensation-diode ($D_{COMP2}$) 1361. The cathode-terminal of the second-compensation-diode ($D_{COMP2}$) 1361 is connected to the first terminal of the second resistor (R2) 1328.

As discussed above, the root cause of G2P error is the load reactance change in the DSA core. The first- and second-attenuation-diodes (D1, D2) 1320, 1321 show a capacitive loading (Coff) at the RF path in off-state (bypass mode), while they show a resistive loading (Ron) at the RF path in on-state (attenuation mode). In FIG. 13, instead of using a parallel tuning-inductor to tune out the Coff (although in some examples a tuning-inductor L1 can be used too), an extra branch of diodes (the first- and second-compensation-diodes ($D_{COMP1}$, $D_{COMP2}$)) is used to introduce shunt capacitance in the attenuation mode. Thus, D1 and D2 show capacitive loading both in bypass and attenuation mode. By properly optimizing the values for $D_{COMP1}$ and $D_{COMP2}$, a reduced G2P error can be achieved at the center frequency. Since an LC resonant circuit usually has a narrower frequency bandwidth than an RC network, the circuit of FIG. 13 advantageously has a wider frequency bandwidth than that of FIG. 3 (which includes a tuning-inductor L1).

The circuit of FIG. 13 also includes one or both of the following optional components: a first-compensation-capacitor ($C_{COMP1}$) 1362; and a second-compensation-capacitor ($C_{COMP2}$) 1363. The values for the first- and second-compensation-capacitors ($C_{COMP1}$, $C_{COMP2}$) 1362, 1363 can also be optimized to reduce the G2P error at the center frequency, potentially to bring the G2P error down to zero.

The first-compensation-capacitor ($C_{COMP1}$) 1362 is connected in series between: i) the internal-node 1315; and ii) the connection between the cathode-terminal of the first-compensation-diode ($D_{COMP1}$) 1360 and the anode-terminal of the second-compensation-diode ($D_{COMP2}$) 1361. The second-compensation-capacitor ($C_{COMP2}$) 1363 is connected in series between: i) the connection between the cathode-terminal of the first-compensation-diode ($D_{COMP1}$) 1360 and the anode-terminal of the second-compensation-diode ($D_{COMP2}$) 1361; and ii) the reference-node 1316.

The compensation capacitance $C_{COMP1}$ and $C_{COMP2}$ values are highly dependent on the substrate capacitance of $D_{COMP1}$ and $D_{COMP2}$. As indicated above, $C_{COMP1}$ and $C_{COMP2}$ could even be removed in some cases. Furthermore, in a practical layout, the DC decoupling capacitors C1, C2, C3 are chip area dominant. $C_{COMP1}$ and $C_{COMP2}$ values are typically less than 1% of C1. Thus, the inclusion of $C_{COMP1}$ and $C_{COMP2}$ does not significantly increase chip area.

Figure 14:
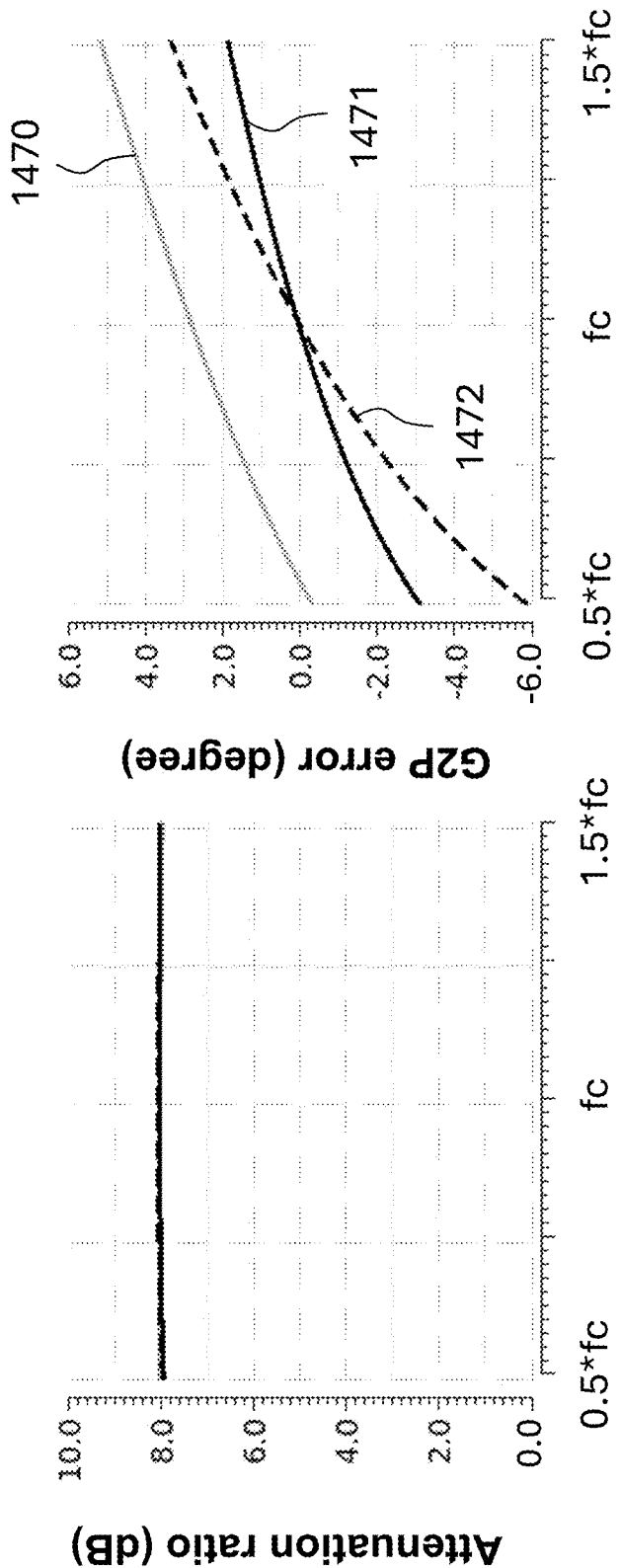
FIG. 14 shows simulation results to compare different DSA core circuits.

FIG. 14 shows simulation results to compare different DSA core circuits. The lightest lines 1470 shows the performance of a DSA core without a parallel tuning-inductor, such as the circuit of FIG. 6A. The dark dashed lines 1472 shows the performance of a DSA core with a parallel tuning-inductor, such as the circuit of FIG. 6B. The dark solid lines 1471 show the performance of a DSA core with an extra PiN diode branch, such as the circuit shown in FIG. 13.

The left-hand plot in FIG. 14 shows that all three DSA cores have wideband 8-dB attenuation ratio over the frequency. The right-hand plot in FIG. 14) shows that both the parallel L and the extra PiN diode branch correct G2P error at the center frequency very well. Moreover, with the extra PiN diode branch, the DSA core has less G2P error over the frequency variation (as shown by the solid dark line 1471). In other words, the DSA core of FIG. 13 has a wider operational frequency bandwidth.

One or more of the examples disclosed herein relate to a novel Digital-Step-Attenuator (DSA) circuit based on a PiN diode device. The DSA core can be connected as shunt to a RF signal path. The DSA is switched between bypass or attenuation mode by reverse-biasing or forward-biasing the PiN diodes, respectively. Such a circuit has the feature of low insertion loss, low gain-to-phase error and compact layout size. Based on such DSA cores, there is also provided a distributed multiple-bit DSA line-up which can be integrated between amplifiers. By adding amplifiers between each DSA stage, the DSA impedance variation between by-pass and attenuation mode can be isolated. The proposed line-up has a low gain step error (with few glitches between attenuation state transitions).

The following example circuit topologies are disclosed in order to improve the Digital-Step-Attenuator (DSA).

- A 1-bit DSA core has better RF performance: lower insertion loss and less gain-to-phase error
- A 1-bit DSA core has more compact layout size and is more flexible to arrange in layout floorplan
- Multiple DSA cores are distributed between amplifiers in a line-up: the proposed line-up has compact layout size and lower gain step error (less glitches between attenuation state transitions)

An example 1-bit DSA core of the present disclosure can provide the following features:

1) It can only use PiN diode for RF switching. PiN diodes can have has much better RF characteristic than MOS as a switch.
2) The DSA core is in parallel connection with the RF signal path. Thus, it will enable a more compact and flexible layout arrangement.
3) In the bypass mode, the PiN diodes can be reverse-biased with a lower Coff. As a result, the DSA core will have lower insertion loss and less gain-to-phase error.
4) A parallel inductor can be used to tune out Coff and further improve the gain-to-phase error.

The following additional features can also be provided:

1) A 1-bit DSA integrated between two amplifiers: parallel inductor in DSA core is merged into the amplifier supply inductor to decrease the layout size.
2) Distributed multiple-bit DSA line-up: amplifiers are added between each DSA stage to isolate the DSA impedance change between bypass and attenuation mode. This line-up improves gain step error (with less glitches between attenuation state transitions).
3) Some detailed bias circuit embodiments for the DSA core.

Example applications of the attenuations circuits disclosed herein include RF and millimeter-wave front-end IC and beamformer products for 5G and future 6G communication networks.

It will be appreciated that any components that are described or illustrated herein as being coupled or connected could be directly or indirectly coupled or galvanically connected. That is, one or more components could be located between two components that are said to be coupled or connected whilst still enabling the required functionality to be achieved.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An attenuation circuit comprising:
   a connection-node for connecting to an RF connection;
   a first-control-node configured to receive a first-control-signal;
   a second-control-node configured to receive a second-control-signal;
   an internal-node;
   a reference-node for connecting to a reference terminal;
   an isolation-capacitor connected in series between the connection-node and the internal-node;
   a first-bias-resistor connected in series between the first-control-node and the internal-node;
   a second-bias-resistor connected in series between the internal-node and the second-control-node;
   a first-attenuation-diode connected in series between the first-control-node and the internal-node, wherein the anode of the first-attenuation-diode is closest to the first-control-node, and wherein the first-attenuation-diode is connected in parallel with the first-bias-resistor;
   a second-attenuation-diode connected in series between the internal-node and the second-control-node, wherein the anode of the second-attenuation-diode is closest to the internal-node, and wherein the second-attenuation-diode is connected in parallel with the second-bias-resistor;

a first-decoupling-capacitor connected in series between the first-control-node and the reference-node; and a second-decoupling-capacitor connected in series between the second-control-node and the reference-node.

2. The attenuation circuit of claim 1, wherein the attenuation circuit comprises a single connection-node for connecting to an RF connection in parallel.

3. The attenuation circuit of claim 1, wherein the attenuation circuit is in an attenuation mode of operation when the first-control-signal has a higher voltage than the second-control-signal.

4. The attenuation circuit of claim 1, wherein the attenuation circuit is in a bypass mode of operation when the first-control-signal has a lower voltage than the second-control-signal.

5. The attenuation circuit of claim 1, further comprising a first-attenuation-resistor and a second-attenuation-resistor, wherein:
the first-attenuation-resistor and the first-attenuation-diode are connected in series with each other between the first-control-node and the internal-node; and
the second-attenuation-resistor and the second-attenuation-diode are connected in series with each other between the internal-node and the second-control-node.

6. The attenuation circuit of claim 5, wherein the first-attenuation-resistor and the first-attenuation-diode are connected in series with each other, in that order, between the first-control-node and the internal-node.

7. The attenuation circuit of claim 5, wherein the second-attenuation-diode and the second-attenuation-resistor and are connected in series with each other, in that order, between the internal-node and the second-control-node.

8. The attenuation circuit of claim 1, further comprising a tuning-inductor connected in series between the connection-node and an AC-reference-node.

9. An attenuation circuit comprising:
a connection-node for connecting to an RF connection;
a first-control-node configured to receive a first-control-signal;
a second-control-node configured to receive a second-control-signal;
an internal-node;
a reference-node for connecting to a reference terminal;
an isolation-capacitor connected in series between the connection-node and the internal-node;
a first-bias-resistor connected in series between the first-control-node and the internal-node;
a second-bias-resistor connected in series between the internal-node and the second-control-node;
a first-attenuation-diode connected in series between the first-control-node and the internal-node, wherein the anode of the first-attenuation-diode is closest to the first-control-node;
a second-attenuation-diode connected in series between the internal-node and the second-control-node, wherein the anode of the second-attenuation-diode is closest to the internal-node;
a first-decoupling-capacitor connected in series between the first-control-node and the reference-node;
a second-decoupling-capacitor connected in series between the second-control-node and the reference-node;
a first-attenuation-resistor having a first terminal and a second terminal;
a second-attenuation-resistor having a first terminal and a second terminal;
a first-compensation-diode having an anode-terminal and a cathode-terminal; and
a second-compensation-diode having an anode-terminal and a cathode-terminal;
wherein:
the first-terminal of the first-resistor is connected to the first-control-node;
the second-terminal of the first-resistor is connected to the anode-terminal of the first-attenuation-diode;
the cathode-terminal of the first-attenuation-diode is connected to the internal-node;
the anode-terminal of the second-attenuation-diode is connected to the internal-node;
the cathode-terminal of the second-attenuation-diode is connected to the first-terminal of the second-attenuation-resistor;
the second-terminal of the second-attenuation-resistor is connected to the second-control-node;
the anode-terminal of the first-compensation-diode is connected to the second-terminal of the first-resistor;
the cathode-terminal of the first-compensation-diode is connected to the anode-terminal of the second-compensation-diode; and
the cathode-terminal of the second-compensation-diode is connected to the first terminal of the second resistor.

10. The attenuation circuit of claim 9, further comprising one or both of:
a first-compensation-capacitor connected in series between: i) the internal-node; and ii) the connection between the cathode-terminal of the first-compensation-diode and the anode-terminal of the second-compensation-diode; and
a second-compensation-capacitor connected in series between: i) the connection between the cathode-terminal of the first-compensation-diode and the anode-terminal of the second-compensation-diode; and ii) the reference-node.

11. The attenuation circuit of claim 1, wherein the first-attenuation-diode and the second-attenuation-diode are PiN diodes.

12. The attenuation circuit of claim 1, further comprising an amplifier-inductor connected in series between the connection-node and a supply-node, wherein the amplifier-inductor is configured to:
provide some of the functionality of an amplifier that provides an output signal to the connection-node; and
compensate for the off-capacitance of the first- and second-attenuation-diodes.

13. An amplifier circuit comprising:
a first amplifier that has a first-amplifier-output-terminal;
an attenuation circuit that includes
a connection-node connected to the first-amplifier-output-terminal,
a first-control-node configured to receive a first-control-signal,
a second-control-node configured to receive a second-control-signal,
an internal-node,
a reference-node for connecting to a reference terminal,
an isolation-capacitor connected in series between the connection-node and the internal-node,
a first-bias-resistor connected in series between the first-control-node and the internal-node,
a second-bias-resistor connected in series between the internal-node and the second-control-node, a first-attenuation-diode connected in series between the first-control-node and the internal-node, wherein the anode of the first-attenuation-diode is closest to the first-control-node, and wherein the first-attenuation-diode is connected in parallel with the first-bias-resistor, a second-attenuation-diode connected in series between the internal-node and the second-control-node, wherein the anode of the second-attenuation-diode is closest to the internal-node, and wherein the second-attenuation-diode is connected in parallel with the second-bias-resistor, a first-decoupling-capacitor connected in series between the first-control-node and the reference-node, and a second-decoupling-capacitor connected in series between the second-control-node and the reference-node; and a first-amplifier-inductor connected in series between the connection-node and a supply-node, wherein the first-amplifier-inductor is configured to:
provide some of a functionality of the first amplifier; and
compensate for an off-capacitance of each of the first- and second-attenuation-diodes.

14. The attenuation circuit of claim 5, further comprising:
a first-attenuation-resistor having a first terminal and a second terminal;
a second-attenuation-resistor having a first terminal and a second terminal;
a first-compensation-diode having an anode-terminal and a cathode-terminal; and
a second-compensation-diode having an anode-terminal and a cathode-terminal;
wherein:
the first-terminal of the first-resistor is connected to the first-control-node;
the second-terminal of the first-resistor is connected to the anode-terminal of the first-attenuation-diode;
the cathode-terminal of the first-attenuation-diode is connected to the internal-node;
the anode-terminal of the second-attenuation-diode is connected to the internal-node;
the cathode-terminal of the second-attenuation-diode is connected to the first-terminal of the second-attenuation-resistor;
the second-terminal of the second-attenuation-resistor is connected to the second-control-node;
the anode-terminal of the first-compensation-diode is connected to the second-terminal of the first-resistor;
the cathode-terminal of the first-compensation-diode is connected to the anode-terminal of the second-compensation-diode; and
the cathode-terminal of the second-compensation-diode is connected to the first terminal of the second resistor.

15. The amplifier circuit of claim 13, further comprising a control signal generator that is configured to provide the first-control-signal and the second-control-signal such that:
the attenuation circuit is in an attenuation mode of operation when the first-control-signal has a higher voltage than the second-control-signal; and
the attenuation circuit is in a bypass mode of operation when the first-control-signal has a lower voltage than the second-control-signal.

16. The amplifier circuit of claim 14, further comprising a control signal generator that is configured to provide the first-control-signal and the second-control-signal such that:
the attenuation circuit is in an attenuation mode of operation when the first-control-signal has a higher voltage than the second-control-signal; and
the attenuation circuit is in a bypass mode of operation when the first-control-signal has a lower voltage than the second-control-signal.

17. The attenuation circuit of claim 3, wherein the attenuation circuit is in a bypass mode of operation when the first-control-signal has a lower voltage than the second-control-signal.

18. The attenuation circuit of claim 3, further comprising a first-attenuation-resistor and a second-attenuation-resistor, wherein:
the first-attenuation-resistor and the first-attenuation-diode are connected in series with each other between the first-control-node and the internal-node; and
the second-attenuation-resistor and the second-attenuation-diode are connected in series with each other between the internal-node and the second-control-node.

19. The attenuation circuit of claim 5, further comprising a tuning-inductor connected in series between the connection-node and an AC-reference-node.

* * * * *